(12) United States Patent
Hu et al.

(10) Patent No.: US 12,288,698 B2
(45) Date of Patent: Apr. 29, 2025

(54) METHODS FOR RETAINING A PROCESSING LIQUID ON A SURFACE OF A SEMICONDUCTOR SUBSTRATE

(71) Applicant: Tokyo Electron Limited, Tokyo (JP)

(72) Inventors: Shan Hu, Albany, NY (US); Peter D'Elia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 32 days.

(21) Appl. No.: 18/112,120

(22) Filed: Feb. 21, 2023

(65) Prior Publication Data

US 2024/0282597 A1 Aug. 22, 2024

(51) Int. Cl.
*H01L 21/67* (2006.01)
*H01L 21/02* (2006.01)
*H01L 21/687* (2006.01)

(52) U.S. Cl.
CPC .. *H01L 21/67051* (2013.01); *H01L 21/02052* (2013.01); *H01L 21/67034* (2013.01); *H01L 21/68764* (2013.01)

(58) Field of Classification Search
CPC ......... H01L 21/67051; H01L 21/02052; H01L 21/67034; H01L 21/68764
See application file for complete search history.

(56) References Cited

U.S. PATENT DOCUMENTS

| | | | |
|---|---|---|---|
| 6,793,836 B2 | 9/2004 | Tsung-Kuei et al. | |
| 7,354,484 B2 | 4/2008 | Orii et al. | |
| 8,813,764 B2 | 8/2014 | Magni et al. | |
| 9,343,335 B1 * | 5/2016 | Kukas | H01L 21/6715 |
| 10,048,664 B2 | 8/2018 | Hasimoto et al. | |
| 11,460,775 B2 | 10/2022 | Kang et al. | |
| 2015/0083167 A1 * | 3/2015 | Yoshizumi | H01L 21/02052 134/95.1 |
| 2018/0369856 A1 * | 12/2018 | Takahashi | H01L 21/67178 |
| 2020/0073244 A1 | 3/2020 | Kang et al. | |
| 2021/0287919 A1 | 9/2021 | Hurd et al. | |
| 2021/0313239 A1 * | 10/2021 | Goh | H01L 21/67253 |
| 2022/0371048 A1 | 11/2022 | Miyakubo | |

FOREIGN PATENT DOCUMENTS

| | | |
|---|---|---|
| CN | 115527839 | 12/2022 |
| JP | 2003145016 | 5/2003 |
| JP | 2013214757 | 10/2013 |
| JP | 6085423 | 2/2017 |

OTHER PUBLICATIONS

Machine Translation of JP2013-214757A (Year: 2013).*
International Search Report and the Written Opinion of the International Searching Authority, or the Declaration, PCT/US2024/010514, Apr. 29, 2024, 10 pgs.

* cited by examiner

*Primary Examiner* — Sharidan Carrillo
(74) *Attorney, Agent, or Firm* — Egan, Enders & Huston LLP

(57) ABSTRACT

Improved puddle processes and methods are provided herein for retaining a processing liquid on a surface of a semiconductor substrate. More specifically, improved methods are provided herein for retaining a puddle within a center region of a semiconductor substrate while the substrate is stationary, or rotating at relatively low rotational speeds. In the disclosed embodiments, a puddle is retained within a center region of the semiconductor substrate by a thin film, which is deposited within a peripheral edge region of the substrate before a processing liquid is dispensed within the center region of the substrate to form the puddle.

22 Claims, 18 Drawing Sheets

RECEIVE A SUBSTRATE HAVING A BEVEL THIN FILM WITHIN THE CLEANING CHAMBER

FIRST CLEANING STEP

CLEANING PUDDLE PROCESS

SECOND CLEANING STEP

RINSE STEP

SPIN DRY STEP

RECEIVE A SUBSTRATE HAVING A BEVEL THIN FILM WITHIN THE CLEANING CHAMBER

CLEANING STEP

RINSE STEP

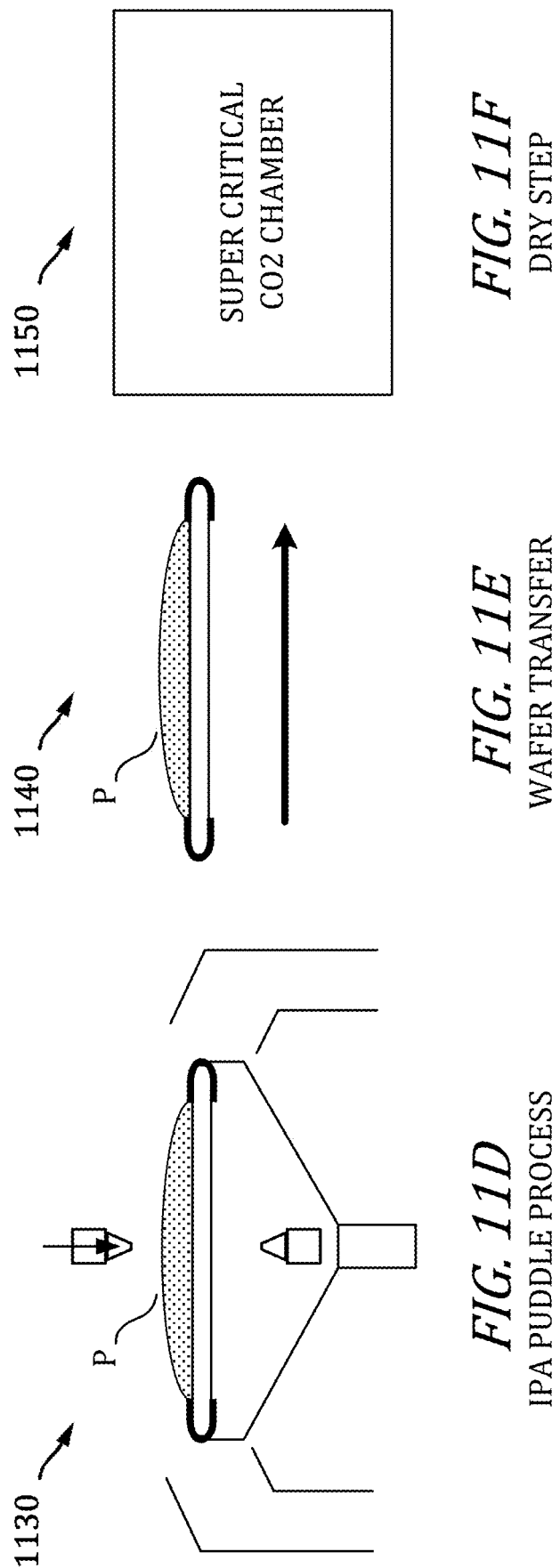

METHODS FOR RETAINING A PROCESSING LIQUID ON A SURFACE OF A SEMICONDUCTOR SUBSTRATE

BACKGROUND

The present disclosure relates to the processing of semiconductor substrates. In particular, it provides novel methods for retaining a processing liquid on a surface of a semiconductor substrate.

Semiconductor fabrication processes may involve a wide variety of processing steps, including depositing, growing, patterning, etching, coating, developing and cleaning steps. Some of these processing steps may be spin-on processes, which are performed on a semiconductor substrate while the semiconductor substrate is disposed within a processing chamber having a spin chuck and at least one liquid dispense nozzle.

FIG. 1A illustrates one example of a processing chamber 100 having a spin chuck 110 and at least one liquid dispense nozzle 120. In a conventional spin-on process, a semiconductor substrate (or wafer W) to be processed is positioned on a spin chuck 110 and held in place, for example, by vacuum pressure or mechanical pin holders. During various processing steps, the spin chuck 110 and the semiconductor substrate W mounted thereon may be rotated at a variable angular velocity by a drive mechanism 115, which may be a stepper motor, etc. The drive mechanism 115 may cause the spin chuck 110 to spin at a variety of rotational speeds during the application and flow of a liquid material onto a surface of the semiconductor substrate W.

At least one nozzle 120 may be provided within the processing chamber 100 for dispensing one or more liquids onto the surface of the semiconductor substrate W. The nozzle 120 may be coupled to a liquid supply unit (not shown) through a liquid supply line 125 for dispensing a variety of processing liquids (L) onto the surface of the semiconductor substrate W. The nozzle 120 can be configured to either spray a desired quantity of the processing liquid onto the substrate surface in the form of a mist, or drop a specific quantity of the processing liquid onto the substrate surface in the form of a puddle.

The processing liquid(s) supplied to the surface of the semiconductor substrate W depend on the processing step(s) being performed. For example, the nozzle 120 may dispense a processing liquid onto the surface of the semiconductor substrate W to coat the substrate surface and form a layer of material (e.g., a metal layer, a dielectric layer, a photoresist, etc.) on the substrate surface. In some cases, a patterning layer may be formed over the material layer and the material layer may be subsequently etched by dispensing an etchant chemical from the nozzle 120 onto the patterning layer. In another example, the nozzle 120 may dispense a develop solution onto the surface of the semiconductor substrate W to develop a layer previously deposited (e.g., a photoresist layer) on the substrate surface. In yet other examples, the nozzle 120 may be utilized to dispense a cleaning chemical and/or a rinse solvent onto the surface of the semiconductor substrate W to clean and/or rinse the substrate surface.

A cup 130 is provided within the processing chamber 100 to capture liquids that are ejected or fall from the surface of the semiconductor substrate W. Spin chuck 110 and drive mechanism 115 are disposed within an opening in the cup 130. The spin chuck 110 supports and rotates (i.e., spins) the semiconductor substrate W about its central normal axis relative to the cup 130, which is stationary. As the spin chuck 110 rotates, the cup 130 captures and collects a majority of the processing liquid (L), which is ejected from the surface of the semiconductor substrate W by the centrifugal forces generated during rotation of the spin chuck 110. The liquid material ejected from the substrate W and collected by the cup 130 is drained via a drain line 135 and drain unit (not shown). An exhaust line 137 and exhaust unit (not shown), such as a vacuum pump or other negative pressure-generating device, may be provided within the processing chamber 100 to remove gaseous species (including but not limited to vapors released from substrate layers during processing) from the processing space inside the cup 130.

In some semiconductor fabrication processes, the nozzle 120 may dispense a processing liquid onto a surface of the semiconductor substrate W while the substrate is stationary, or rotating at relatively low rotational speeds (e.g., 0-50 rotations per minute, RPM), to form a puddle on the substrate surface. For example, a puddle may be formed on the substrate surface during a developing process, an etching process, a cleaning process, etc. Puddles may be utilized to reduce the amount of chemical needed to perform a process, improve the process performance, etc.

It is often desirable to maintain complete chemical coverage within a center region (or active area) of the semiconductor substrate W during a puddle process. However, complete chemical coverage is difficult to maintain in conventional puddle processes, since liquids tend to fall off the edge of the substrate (even when the substrate is stationary), due to the low surface tension of the liquids dispensed onto the substrate and/or the beveled edges of the substrate.

FIG. 1B illustrates a portion of the semiconductor substrate W shown in box 140 of FIG. 1A. As shown in FIG. 1B, the semiconductor substrate W includes a frontside surface 150, a backside surface 160, a side edge surface 170 and a peripheral edge region 180 having a beveled edge. The beveled edge includes a front beveled edge 182 which slopes from the frontside surface 150 to the side edge surface 170, and a back beveled edge 184 which slopes from the backside surface 160 to the side edge surface 170. When a processing liquid (L) is dispensed onto a surface (e.g., the frontside surface 150) of the semiconductor substrate W while the substrate is stationary, or rotating at relatively low rotational speeds, to form a puddle on the substrate surface, the relatively low surface tension of the processing liquid and/or the beveled edges 182/184 of the semiconductor substrate W may cause a portion of the processing liquid to fall off the edge of the substrate. This prevents the puddle process from maintaining complete chemical coverage within the center region of the semiconductor substrate W.

A need, therefore, remains for improved methods for retaining a processing liquid on a surface of a semiconductor substrate during a puddle process.

SUMMARY

The present disclosure provides improved puddle processes and methods for retaining a processing liquid on a surface of a semiconductor substrate. More specifically, the present disclosure provides improved methods for retaining a puddle within a center region of a semiconductor substrate while the substrate is stationary, or rotating at relatively low rotational speeds. In the disclosed embodiments, a puddle is retained within a center region of the semiconductor substrate by a thin film, which is deposited within a peripheral edge region of the substrate before a processing liquid is dispensed within the center region of the substrate to form the puddle.

The thin film—which is deposited only within the peripheral edge region, and not within the center region, of the semiconductor substrate—is formed from a material having a lower surface energy than the surface energy of the substrate. The thin film formed within the peripheral edge region of the semiconductor substrate provides a low energy surface that repels the processing liquid away from the peripheral edge region to retain a puddle of the processing liquid within the center region of the semiconductor substrate (as long as the substrate is stationary, or rotating at relatively low rotational speeds). The thin film formed within the peripheral edge region of the semiconductor substrate improves upon conventional puddle processes by maintaining complete chemical coverage within the center region of the semiconductor substrate.

According to one embodiment, a method is provided herein for retaining a processing liquid on a surface of a semiconductor substrate. In some embodiments, the method may begin by receiving a semiconductor substrate having a frontside surface, a backside surface, a side edge surface, a peripheral edge region and a center region. The peripheral edge region of the semiconductor substrate includes the side edge surface and annular portions of the frontside surface and the backside surface adjacent to the side edge surface. The center region of the semiconductor substrate extends from a center of the semiconductor substrate to the peripheral edge region.

Next, the method may include depositing a thin film on the surface of the semiconductor substrate and dispensing a processing liquid on the surface of the semiconductor substrate after depositing the thin film. The thin film is deposited only within the peripheral edge region, and not within the center region, of the semiconductor substrate. The processing liquid, on the other hand, is dispensed within the center region of the semiconductor substrate to form a puddle of the processing liquid within the center region. Because the thin film deposited within the peripheral edge region has a lower surface energy than the surface of the semiconductor substrate, the thin film provides a low energy surface that repels the processing liquid away from the peripheral edge region of the semiconductor substrate to retain the puddle of the processing liquid within the center region of the semiconductor substrate.

In some embodiments, the method may deposit the thin film by using a spin-on process to coat an entirety of the peripheral edge region with the thin film, including the side edge surface and the annular portions of the frontside surface and the backside surface of the semiconductor substrate.

In some embodiments, the method may deposit the thin film within the peripheral edge region of the semiconductor substrate while the semiconductor substrate is spinning at a first rotational speed, and the processing liquid may be dispensed within the center region of the semiconductor substrate while the semiconductor substrate is stationary or spinning at a second rotational speed, which is less than the first rotational speed, to form the puddle of the processing liquid within the center region. In one example embodiment, the first rotational speed may be selected from a first range consisting of 200 to 3000 rotations per minute (RPM) and the second rotational speed may be selected from a second range consisting of 0 to 50 RPM.

In some embodiments, the method may deposit the thin film by depositing a material within the peripheral edge region of the semiconductor substrate that is not etched or dissolved by the processing liquid dispensed within the center region of the semiconductor substrate. For example, the thin film deposited within the peripheral edge region may include a fluoropolymer material, a spin-on carbon (SOC) material, a spin-on silicon carbide (SIC) material or a spin-on self-aligned monolayer (SAM). The processing liquid dispensed within the center region may include a cleaning solvent, a rinsing solvent, a drying solvent, a developer solvent or an etchant chemical.

In some embodiments, the thin film may be deposited within a processing chamber comprising a frontside bevel nozzle. In such embodiments, said depositing the thin film may include using the frontside bevel nozzle to deposit the material onto the annular portion of the frontside surface while spinning the semiconductor substrate at a rotational speed, which causes the deposited material to wrap around the side edge surface of the semiconductor substrate to coat the annular portion of the backside surface.

In some embodiments, the thin film may be deposited within a processing chamber comprising a backside bevel nozzle. In such embodiments, said depositing the thin film include using the backside bevel nozzle to deposit the material onto the annular portion of the backside surface while spinning the semiconductor substrate at a rotational speed, which causes the deposited material to wrap around the side edge surface of the semiconductor substrate to coat the annular portion of the frontside surface.

In some embodiments, the thin film may be deposited within a processing chamber comprising a backside nozzle. In such embodiments, said depositing the thin film may include using the backside nozzle to deposit the material onto the backside of the semiconductor substrate near the center of the semiconductor substrate while spinning the semiconductor substrate at a rotational speed, which causes the deposited material to cover the backside surface and wrap around the side edge surface of the semiconductor substrate to coat the annular portion of the frontside surface.

In some embodiments, the method may dispense the processing liquid within a first processing chamber, and the method may further include transferring the semiconductor substrate from the first processing chamber to a second processing chamber after dispensing the processing liquid on the surface of the semiconductor substrate. In such embodiments, said depositing the thin film on the surface of the semiconductor substrate may retain the puddle of the processing liquid within the center region of the semiconductor substrate during said transferring.

According to another embodiment, a method is provided herein for cleaning a surface of a semiconductor substrate. In some embodiments, the method may begin by receiving a semiconductor substrate having a frontside surface, a backside surface, a side edge surface, a peripheral edge region and a center region. The peripheral edge region of the semiconductor substrate includes the side edge surface and annular portions of the frontside surface and the backside surface adjacent to the side edge surface. The center region of the semiconductor substrate extends from a center of the semiconductor substrate to the peripheral edge region.

The method may further include depositing a thin film on the surface of the semiconductor substrate, wherein the thin film is deposited only within the peripheral edge region, and not within the center region, of the semiconductor substrate, and wherein the thin film has a lower surface energy than the surface of the semiconductor substrate.

After depositing the thin film, the method may further include: (a) dispensing a cleaning solvent on the surface of the semiconductor substrate, wherein the cleaning solvent is dispensed within the center region of the semiconductor substrate for a first period of time while the semiconductor substrate is spinning, and (b) dispensing the cleaning solvent within the center region of the semiconductor substrate for a second period of time while the semiconductor substrate is stationary to form a puddle of the cleaning solvent within the center region. Because the thin film deposited within the peripheral edge region has a lower surface energy than the surface of the semiconductor substrate, the thin film provides a low energy surface that repels the cleaning solvent away from the peripheral edge region of the semiconductor substrate to retain the puddle of the cleaning solvent within the center region of the semiconductor substrate.

In some embodiments, the method may deposit the thin film by using a spin-on process to coat an entirety of the peripheral edge region with the thin film, including the side edge surface and the annular portions of the frontside surface and the backside surface of the semiconductor substrate.

In some embodiments, the method may deposit the thin film by depositing a fluoropolymer material, a spin-on carbon (SOC) material, a spin-on silicon carbide (SIC) material or a spin-on self-aligned monolayer (SAM) within the peripheral edge region of the semiconductor substrate.

In some embodiments, the method may perform additional steps after dispensing the cleaning solvent within the center region of the semiconductor substrate for the second period of time. For example, the method may further include dispensing the cleaning solvent within the center region of the semiconductor substrate for a third period of time while the semiconductor substrate is spinning, rinsing the surface of the semiconductor substrate with a rinse solvent to remove the cleaning solvent from the surface of the semiconductor substrate, and spinning the semiconductor substrate to dry the surface of the semiconductor substrate.

According to yet another embodiment, a method is provided herein for cleaning a surface of a semiconductor substrate. In some embodiments, the method may begin by receiving a semiconductor substrate having a frontside surface, a backside surface, a side edge surface, a peripheral edge region and a center region. The peripheral edge region of the semiconductor substrate includes the side edge surface and annular portions of the frontside surface and the backside surface adjacent to the side edge surface. The center region of the semiconductor substrate extends from a center of the semiconductor substrate to the peripheral edge region.

The method may further include depositing a thin film on the surface of the semiconductor substrate, wherein the thin film is deposited only within the peripheral edge region, and not within the center region, of the semiconductor substrate, and wherein the thin film has a lower surface energy than the surface of the semiconductor substrate.

After depositing the thin film, the method may further include: (a) dispensing a first solvent on the surface of the semiconductor substrate after depositing the thin film, wherein the first solvent is dispensed within the center region of the semiconductor substrate while the semiconductor substrate is spinning to clean the surface of the semiconductor substrate; (b) dispensing a second solvent on the surface of the semiconductor substrate after dispensing the first solvent, wherein the second solvent is dispensed within the center region of the semiconductor substrate while the semiconductor substrate is spinning to remove the first solvent from the surface of the semiconductor substrate; and (c) dispensing a third solvent on the surface of the semiconductor substrate after dispensing the second solvent, wherein the third solvent is dispensed within the center region of the semiconductor substrate while the semiconductor substrate is stationary to form a puddle of the third solvent within the center region. Because the thin film deposited within the peripheral edge region has a lower surface energy than the surface of the semiconductor substrate, the thin film provides a low energy surface that repels the third solvent away from the peripheral edge region of the semiconductor substrate to retain the puddle of the third solvent within the center region of the semiconductor substrate.

In some embodiments, the method may deposit the thin film by using a spin-on process to coat an entirety of the peripheral edge region with the thin film, including the side edge surface and the annular portions of the frontside surface and the backside surface of the semiconductor substrate.

In some embodiments, the first solvent may be a cleaning solvent, the second solvent may be a rinse solvent, and wherein the third solvent may be a drying solvent.

In some embodiments, the method may dispense the first solvent, the second solvent and the third solvent within a first processing chamber, and the method may further include transferring the semiconductor substrate from the first processing chamber to a second processing chamber after dispensing the third solvent on the surface of the semiconductor substrate to form the puddle of the third solvent within the center region. In such embodiments, the thin film deposited on the surface of the semiconductor substrate may retain the puddle of the third solvent within the center region of the semiconductor substrate during said transferring.

In some embodiments, the first processing chamber may be a cleaning chamber and the second processing chamber may be a supercritical processing chamber. In such embodiments, the method may further include treating the surface of the semiconductor substrate with supercritical carbon dioxide ($CO_2$), and drying the surface of the semiconductor substrate.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 11A-11F illustrate example process steps that can be performed to clean at least one surface of a semiconductor substrate as described in the method of FIG. 10.

DETAILED DESCRIPTION

The present disclosure provides improved puddle processes and methods for retaining a processing liquid on a surface of a semiconductor substrate. More specifically, the present disclosure provides improved methods for retaining a puddle within a center region of a semiconductor substrate while the substrate is stationary, or rotating at relatively low rotational speeds. In the disclosed embodiments, a puddle is retained within a center region of the semiconductor substrate by a thin film, which is deposited within a peripheral edge region of the substrate before a processing liquid is dispensed within the center region of the substrate to form the puddle.

The thin film—which is deposited only within the peripheral edge region, and not within the center region, of the semiconductor substrate—is formed from a material having a lower surface energy than the surface energy of the substrate. The thin film formed within the peripheral edge region of the semiconductor substrate provides a low energy surface that repels the processing liquid away from the peripheral edge region to retain a puddle of the processing liquid within the center region of the semiconductor substrate (as long as the substrate is stationary, or rotating at relatively low rotational speeds). The thin film formed within the peripheral edge region of the semiconductor substrate improves upon conventional puddle processes by maintaining complete chemical coverage within the center region of the semiconductor substrate.

Figure 2A:
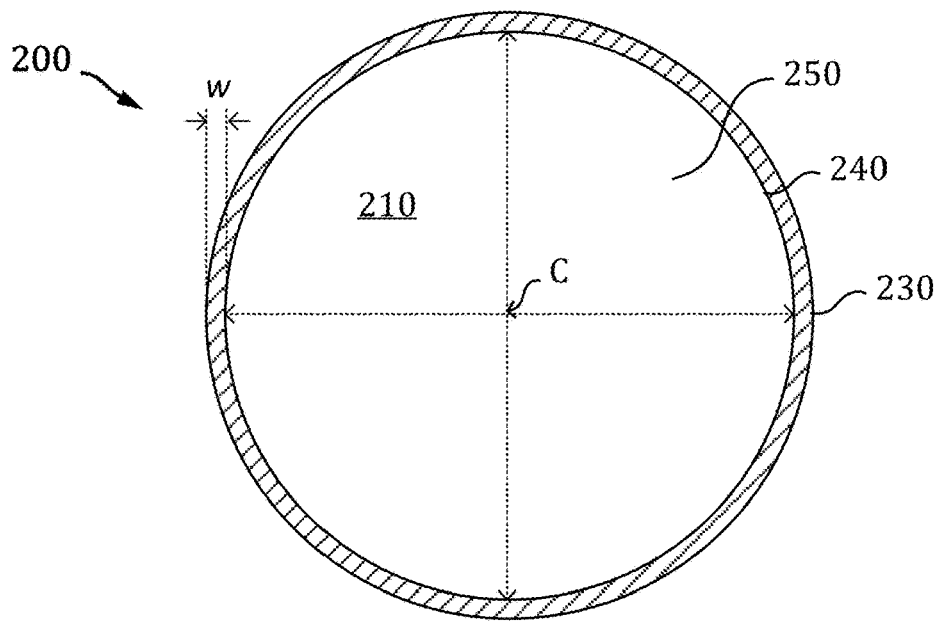
FIG. 2A is a top down view of a semiconductor substrate having a frontside surface, backside surface (shown in FIG. 2C), a side edge surface, a peripheral edge region and a center region.
Figure 2B:
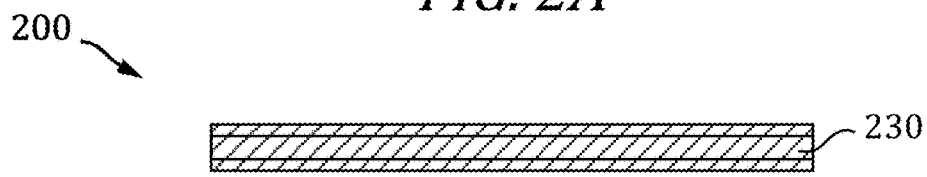
FIG. 2B is a side view of the semiconductor substrate shown in FIGS. 2A and 2C, illustrating the side edge surface of the substrate.
Figure 2C:
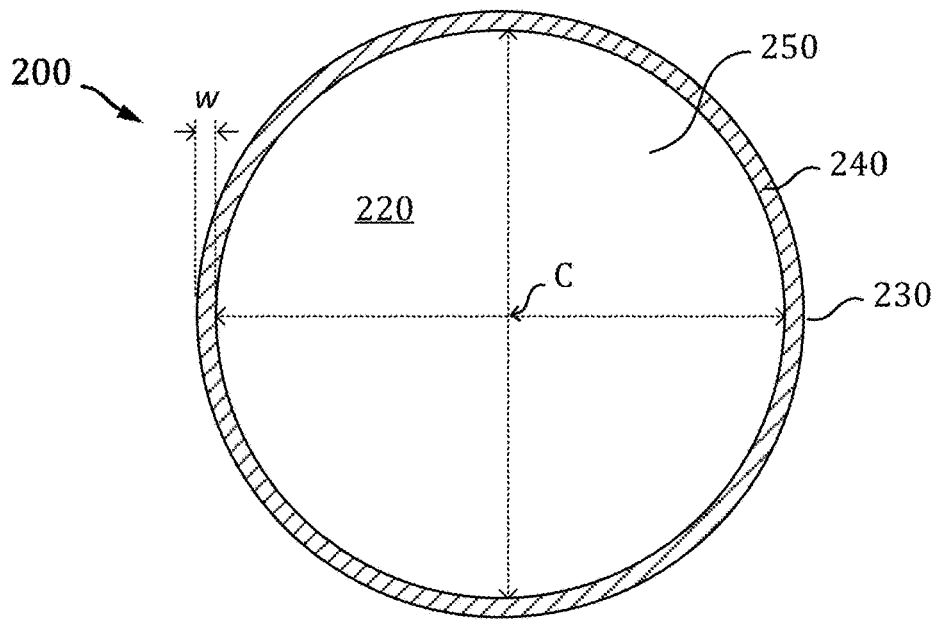
FIG. 2C is a bottom up view of the semiconductor substrate having a frontside surface (shown in FIG. 2A), a backside surface, a side edge surface, a peripheral edge region and a center region.

Turning now to the Drawings, a semiconductor substrate 200 (or wafer, W) is illustrated in FIGS. 2A-2C. The semiconductor substrate 200 shown in FIGS. 2A-2C may be any substrate for which the use of patterned features is desirable. In one embodiment, semiconductor substrate 200 may be a semiconductor substrate having one or more semiconductor processing layers formed thereon. For example, semiconductor substrate 200 may be a substrate that has been subjected to multiple semiconductor processing steps which yield a wide variety of structures and layers, all of which are known in the substrate processing art. In another embodiment, the semiconductor substrate 200 may be a silicon substrate or other bulk substrate comprising a layer of semi-conductive material. The semiconductor substrate 200 shown in FIGS. 2A-2C is disc-shaped and relatively thin. The diameter of the semiconductor substrate 200 may range between approximately 25 mm and 300 mm or even larger.

Figure 1A:
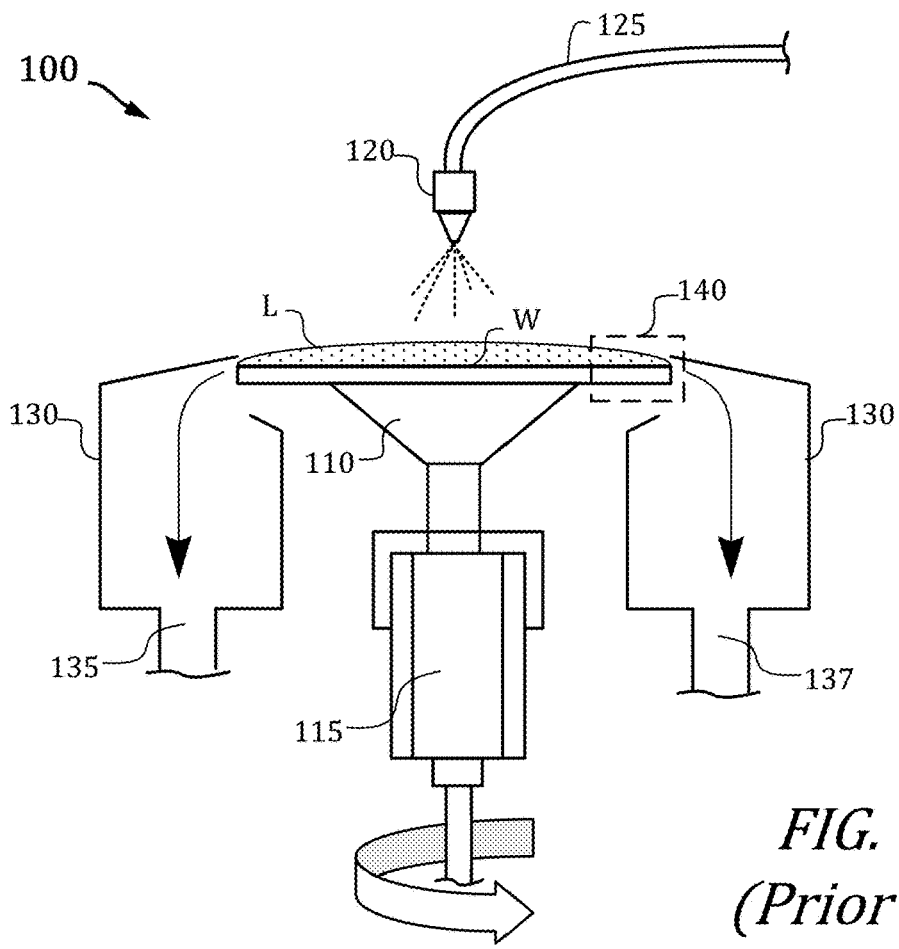
FIG. 1A (PRIOR ART) illustrates an interior of an example processing chamber having a spin chuck for supporting and rotating a semiconductor substrate (W) and at least one nozzle for dispensing a liquid onto a surface of the semiconductor substrate.
Figure 1B:
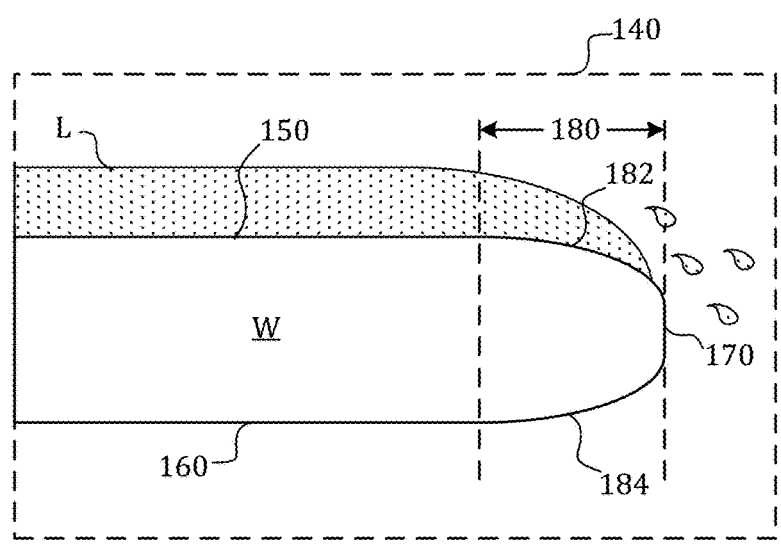
FIG. 1B (PRIOR ART) illustrates a portion of the semiconductor substrate (W) shown in box 140 of FIG. 1A.

As shown in FIGS. 2A-2C, semiconductor substrate 200 has a frontside surface 210, a backside surface 220, a side edge surface 230, a peripheral edge region 240 and a center region 250. The peripheral edge region 240 of the semiconductor substrate 200 (denoted with hashed lines) includes an outer annular portion of the frontside surface 210, the side edge surface 230, and an outer annular portion of the backside surface 220. The annular portions of the frontside surface 210 and the backside surface 220 are located at the periphery of the semiconductor substrate 200 adjacent to the side edge surface 230. A width (w) of the annular portions of the frontside surface 210 and the backside surface 220 is small compared to the diameter (e.g., 300 mm) of the semiconductor substrate 200. For example, the width (w) may range between approximately 1-5 mm. In some embodiments, the annular portions of the frontside surface 210 and the backside surface 220 may be beveled, or may include beveled edges, as shown for example in FIG. 1B.

As shown in FIGS. 2A and 2C, the center region 250 of the semiconductor substrate 200 extends from a center (C) of the semiconductor substrate 200 to the peripheral edge region 240. The center region 250 is the region of the semiconductor substrate 200 where semiconductor structures, or active circuit components, are formed. Unlike the center region 250, no semiconductor structures or active circuit components are formed within the peripheral edge region 240 (or bevel area) of the semiconductor substrate 200.

Figure 3:
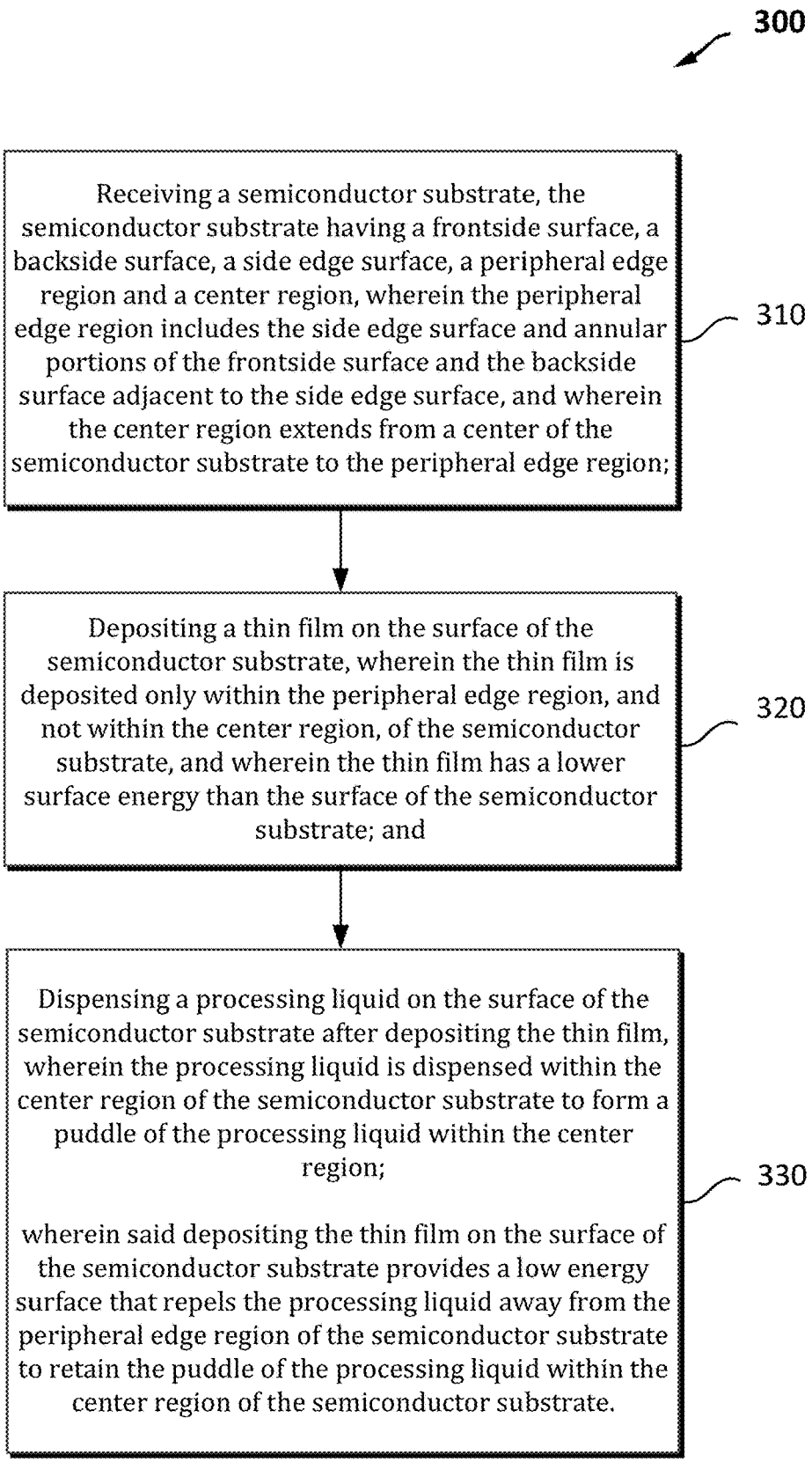
FIG. 3 is a flowchart diagram illustrating one embodiment of a method that utilizes the techniques described herein to retain a processing liquid on a surface of a semiconductor substrate.
Figure 5:
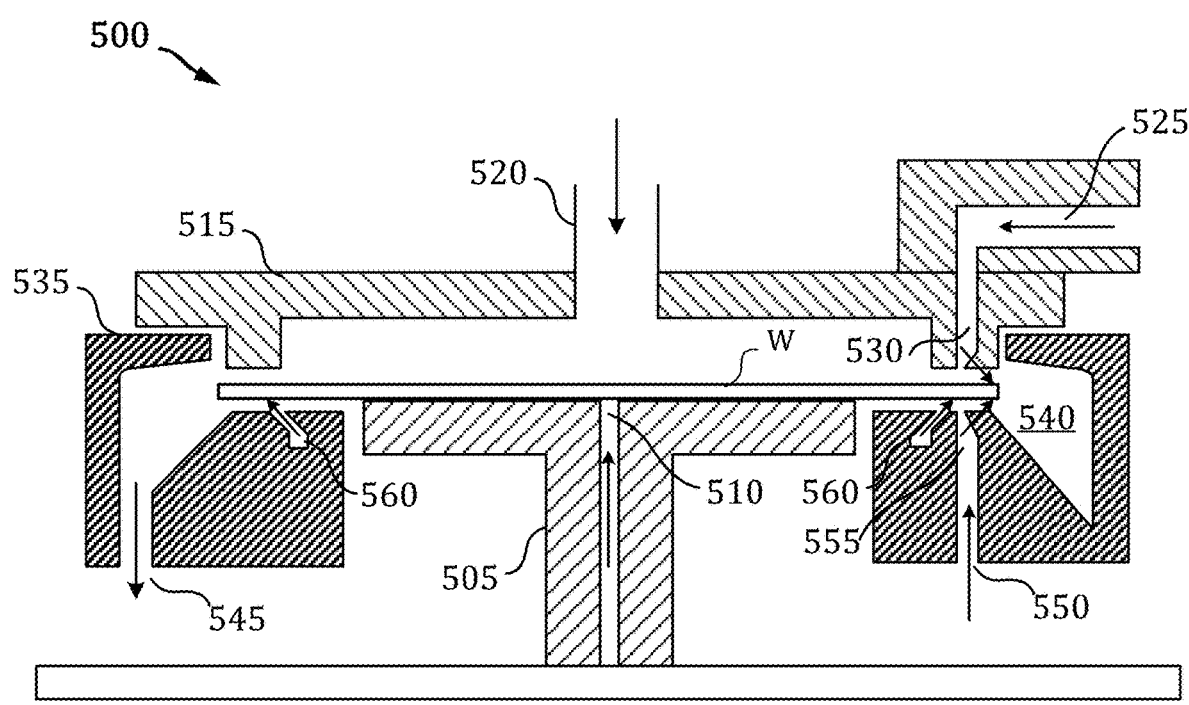
FIG. 5 illustrates an interior of an example processing chamber that can be used to deposit a thin film within a peripheral edge region of a semiconductor substrate (W), as shown in FIGS. 4A-4C.
Figure 7:
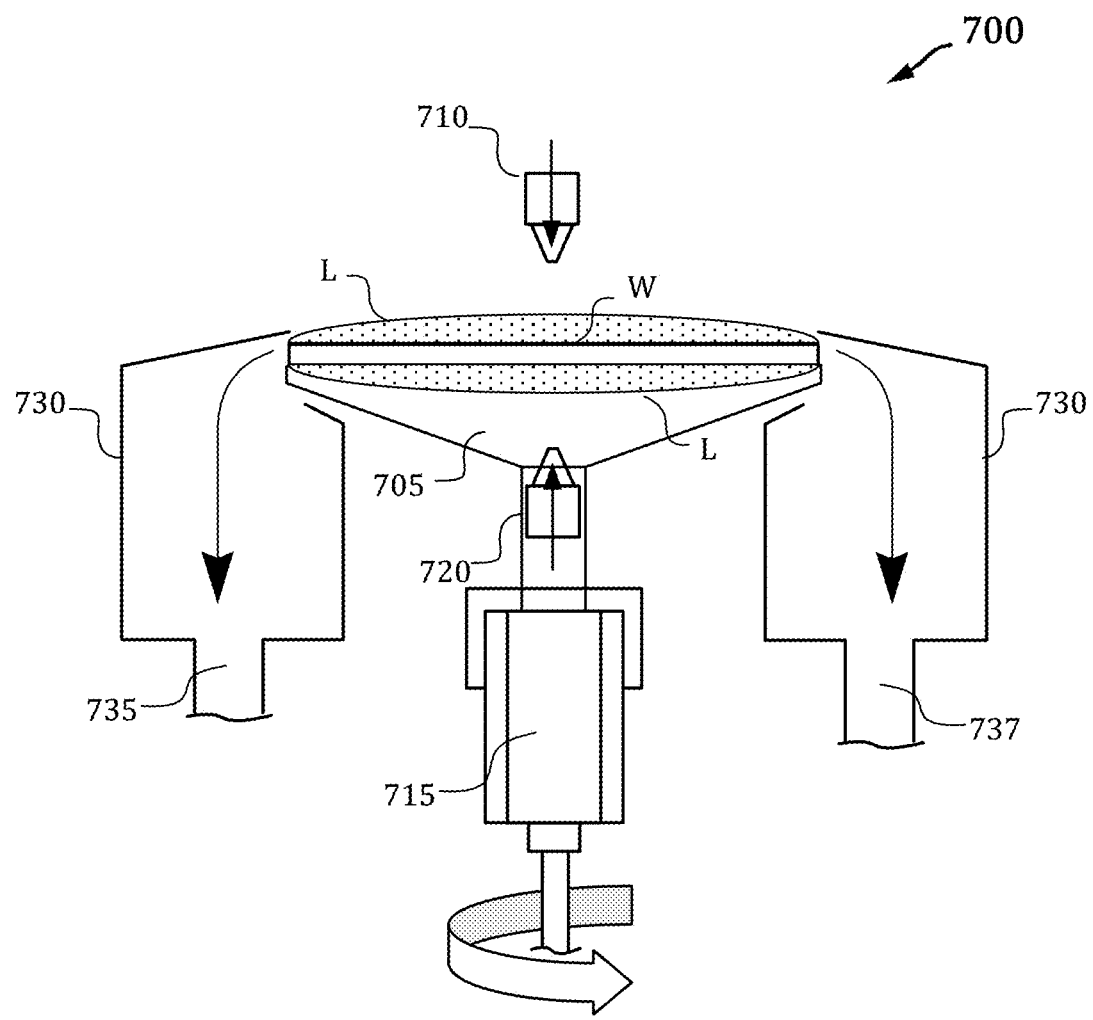
FIG. 7 illustrates an interior of an example processing chamber that can be used to dispense a processing liquid onto at least one surface (e.g., a frontside surface and/or backside surface) of a semiconductor substrate (W)

FIG. 3 illustrates one embodiment of a method 300 that utilizes the techniques described herein to retain a processing liquid on a surface of a semiconductor substrate, such as semiconductor substrate 200 shown in FIGS. 2A-2C. The method shown in FIG. 3 may be performed within one or more semiconductor processing chambers. Examples of processing chambers that may be utilized to perform the method steps shown in FIG. 3 are shown in FIGS. 5 and 7 and described in more detail below. It is recognized, however, that the processing chambers shown and described herein are exemplary and that the method 300 may be alternatively performed within other semiconductor processing chambers and systems, as is known in the art.

In some embodiments, the method 300 may begin by receiving a semiconductor substrate (or wafer, W) in step 310. The semiconductor substrate received in step 310 may generally include a frontside surface 210, a backside surface 220, a side edge surface 230, a peripheral edge region 240 and a center region 250, as shown in FIGS. 2A-2C and discussed above. After receiving the semiconductor substrate in step 310, the method 300 deposits a thin film onto a surface of the semiconductor substrate in step 320. In some embodiments, the thin film may be deposited only within the peripheral edge region 240, and not within the center region 250, of the semiconductor substrate in step 320. In other embodiments, the thin film may be deposited within the peripheral edge region 240, and along the backside surface 220 of the semiconductor substrate, leaving the center region 250 of the frontside surface 210 free of thin film material.

A variety of thin film materials may be deposited onto the surface of the semiconductor substrate in step 320. Examples of thin film materials that may be deposited onto the substrate surface are discussed in more detail below. Regardless of the particular material used, the thin film deposited in step 320 preferably has a lower surface energy than the surface of the semiconductor substrate upon which the thin film is deposited.

A wide variety of deposition processes can be used to deposit the thin film material onto the surface of the semiconductor substrate in step 320. Examples of deposition processes include, but are not limited to, chemical vapor deposition (CVD) processes, plasma enhanced CVD (PECVD) processes, physical vapor deposition (PVD) processes, atomic layer deposition (ALD) processes, spin-on processes and/or other deposition processes. In one embodiment, the thin film is preferably deposited in step 320 via a spin-on deposition process. Unlike other spin-on processes used to deposit thin films, the spin-on deposition process described herein is preferably used to coat the entire peripheral edge region 240 with the thin film, including the side edge surface 230 and the outer annular portions of the frontside surface 210 and the backside surface 220 of the semiconductor substrate 200.

Spin-on deposition processes can be used to dispense liquids onto a surface of a semiconductor substrate while the substrate is rotating or spinning at a specified rotational speed. In spin-on deposition processes, liquids are dispensed from one or more nozzles, which may be configured to spray a desired quantity of the liquid onto the substrate surface in the form of a mist, or drop a specific quantity of the liquid onto the substrate surface. The nozzle(s) may be fixed or movable and can be positioned above and/or below the substrate surface, depending on the surface(s) desired to be coated with the liquid.

Figure 4A:
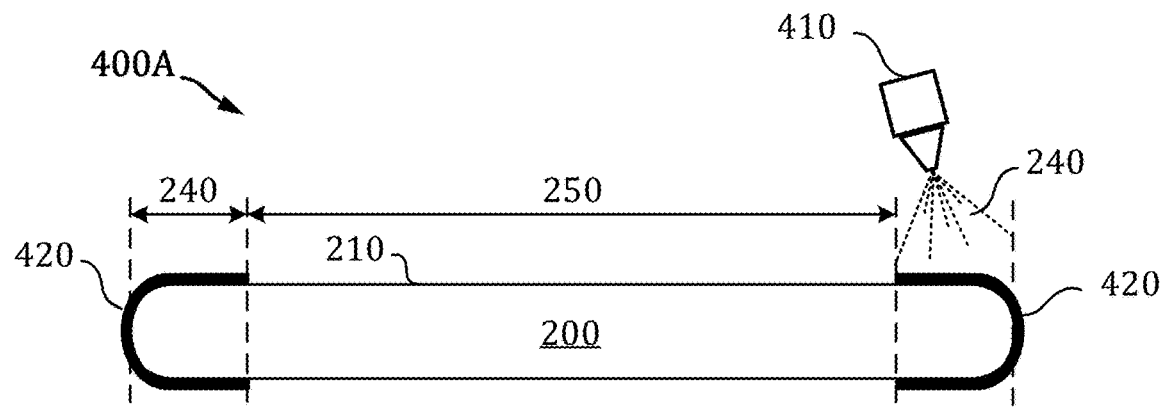
FIG. 4A is a side cross-sectional view of a semiconductor substrate (W), illustrating a thin film being deposited within a peripheral edge region of the substrate using a frontside bevel nozzle.
Figure 4B:
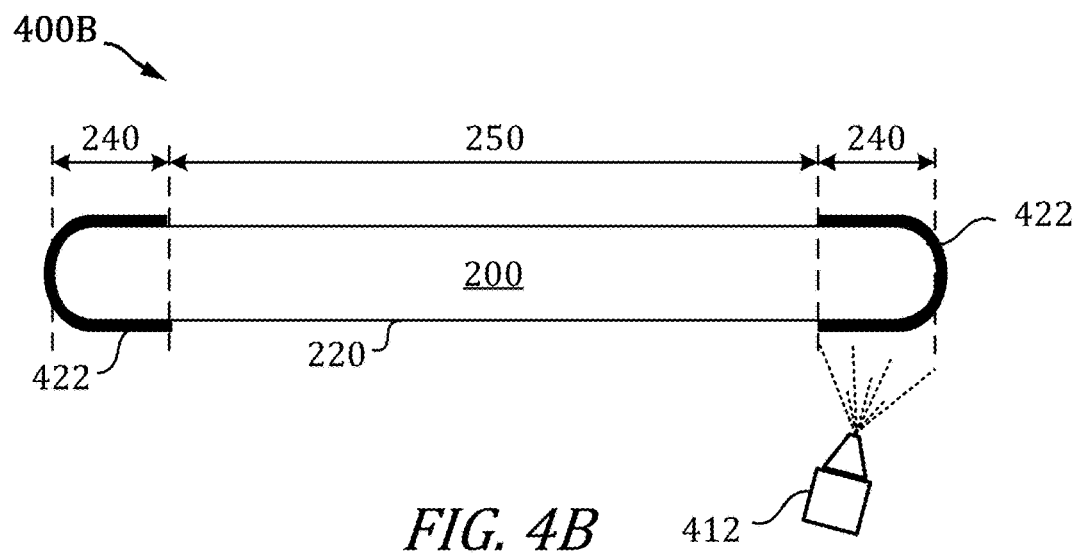
FIG. 4B is a side cross-sectional view of a semiconductor substrate (W), illustrating a thin film being deposited within a peripheral edge region of the substrate using a backside bevel nozzle.
Figure 4C:
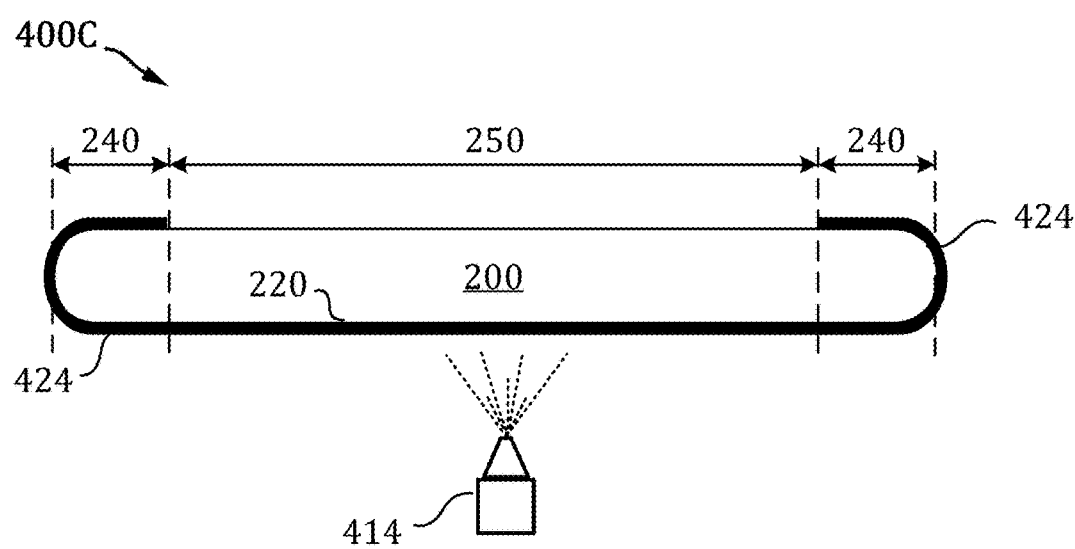
FIG. 4C is a side cross-sectional view of a semiconductor substrate (W), illustrating a thin film being deposited onto a backside surface and within peripheral edge region of the substrate using a backside nozzle.

FIGS. 4A-4C illustrate a variety of nozzles that may be used to deposit a thin film onto the surface of the substrate in step 320 of FIG. 3. For example, a frontside bevel nozzle 410 can be used to deposit a thin film 420 within the peripheral edge region 240 of the substrate 200, as shown in embodiment 400A. As shown in FIG. 4A, the frontside bevel nozzle 410 is positioned above the bevel area on the frontside surface 210 of the semiconductor substrate 200. In some embodiments, the frontside bevel nozzle 410 may be used to dispense a liquid material onto the outer annular portion of the frontside surface 210, while the semiconductor substrate 200 is spinning at a rotational speed (e.g., 200 to 3000 RPM), to deposit the thin film 420 within the peripheral edge region 240 of the substrate 200. The rotational speed of the substrate 200 causes the liquid material dispensed onto the outer annular portion of the frontside surface 210 to wrap around the side edge surface 230 of the semiconductor substrate 200 and at least partially coat the outside annular portion of the backside surface 220 with the thin film 420. The degree of wrap around depends on the viscosity of the liquid and the rotational speed of the substrate 200.

In other embodiments, a backside bevel nozzle 412 may be used to deposit a thin film 422 within the peripheral edge region 240 of the substrate 200, as shown in the embodiment 400B depicted in FIG. 4B. The backside bevel nozzle 412 is positioned below the bevel area on the backside surface 220 of the semiconductor substrate 200. In some embodiments, the backside bevel nozzle 412 may be used to dispense a liquid material onto the outer annular portion of the backside surface 220, while the semiconductor substrate 200 is spinning at a rotational speed (e.g., 200 to 3000 RPM), to deposit the thin film 422 within the peripheral edge region 240 of the substrate 200. The rotational speed of the substrate 200 causes the liquid material dispensed onto the outer annular portion of the backside surface 220 to wrap around the side edge surface 230 of the semiconductor substrate 200 and at least partially coat the outside annular portion of the frontside surface 210 with the thin film 422. As with the previous embodiment, the degree of wrap around may generally depend on the viscosity of the liquid and the rotational speed of the substrate 200.

In yet other embodiments, a backside nozzle 414 may be used to deposit a thin film 424 within the peripheral edge region 240 of the substrate 200, as shown in the embodiment 400C depicted in FIG. 4C. The backside nozzle 414 is positioned below the backside surface 220 near the center of the semiconductor substrate 200. In some embodiments, the backside nozzle 414 may be utilized to dispense a liquid material onto the backside surface 220 of the semiconductor substrate 200 near the center of the substrate 200 while the substrate 200 is spinning at a rotational speed (e.g., 200 to 3000 RPM), to deposit the thin film 424 within the peripheral edge region 240 of the substrate 200. The rotational speed of the substrate 200 causes the liquid material dispensed onto the backside surface 220 to completely cover the backside surface 220 and wrap around the side edge surface 230 to at least partially coat the outside annular portion of the frontside surface 210 with the thin film 424. Again, the degree of wrap around may depend on the viscosity of the liquid and the rotational speed of the substrate 200.

FIG. 5 illustrates one example of a processing chamber 500 that can be used to deposit a thin film (e.g., the thin film 420, 422 or 424) onto a peripheral edge region 240 of a semiconductor substrate 200, as shown in FIGS. 4A-4C and discussed above. In the processing chamber 500 shown in FIG. 5, a semiconductor substrate (W) is mounted frontside up on a spin chuck 505 and held in place, for example, by vacuum pressure. During various processing steps, the spin chuck 505 is rotated at a variable angular velocity by a drive mechanism (not shown), which causes the spin chuck 505 and the semiconductor substrate W mounted thereon to spin at a variety of rotational speeds.

In addition to spin chuck 505, processing chamber 500 includes various nozzles for dispensing liquids onto one or more surfaces of the semiconductor substrate W. The nozzle(s) may be configured to dispense liquids onto the substrate surface(s), while the semiconductor substrate W is stationary or spinning at a variety of rotational speeds. In some embodiments, one or more of the nozzles may be used to dispense a liquid material onto a surface of the semiconductor substrate W, while the substrate is spinning at a specified rotational speed (e.g., 200 to 3000 RPM), to deposit a thin film onto the peripheral edge region of the semiconductor substrate W.

In some embodiments, a backside nozzle 510 provided within a central region of the spin chuck 505 may be used to dispense a liquid material onto the backside surface of the semiconductor substrate W, while the substrate is spinning at the specified rotational speed, to form the thin film 424 within the peripheral edge region 240 of the substrate 200. As shown in FIG. 4C, the thin film 424 covers the entire backside surface 220 and wraps around the side edge surface 230 to at least partially coat or cover the outside annular portion of the frontside surface 210 of the semiconductor substrate 200. This thin film configuration may be undesirable in some processes. For example, covering the entire backside surface 220 of the semiconductor substrate 200 may be undesirable in some cleaning processes, which supply cleaning chemicals to the frontside surface 210 and the backside surface 220 of the semiconductor substrate 200 to clean the frontside and backside surfaces of the substrate. In such processes, it may be preferred to form a thin film 420 or a thin film 422 on the peripheral edge region 240 of the semiconductor substrate 200, as shown in FIGS. 4A and 4B.

As shown in FIG. 5, the processing chamber 500 includes a top cover 515, which is positioned above the spin chuck 505 and the semiconductor substrate W mounted thereon. The top cover 515 includes an air inlet 520 for supplying clean, dry air to the semiconductor substrate W, and a liquid supply line 525 and frontside bevel nozzle 530 for supplying various liquids to the substrate surface. As shown in FIGS. 4A and 5, the frontside bevel nozzle 410/530 is positioned above the bevel area on the frontside surface 210 of the semiconductor substrate 200. In some embodiments, the frontside bevel nozzle 410/530 may be used to dispense a liquid material onto the outer annular portion of the frontside surface 210 of the semiconductor substrate 200, while the substrate is spinning at the specified rotational speed, to form the thin film 420 within the peripheral edge region 240 of the substrate 200, as shown in FIG. 4A.

A drain cup 535 is provided within the processing chamber 500 to capture liquids, which are ejected from the surface of the semiconductor substrate W by the centrifugal forces generated during rotation of the spin chuck 505. The liquids ejected from the substrate surface are collected within a reservoir 540 provided within the drain cup 535 and drained via a drain line 545 and drain unit (not shown). In some embodiments, an exhaust line and exhaust unit (not shown) may be provided within the processing chamber 500 to remove gaseous species from the processing space inside the drain cup 535.

In some embodiments, a liquid supply line 550 and backside bevel nozzle 555 may be provided for supplying various liquids to the substrate surface. As shown in FIGS. 4B and 5, the backside bevel nozzle 412/555 is positioned below the bevel area on the backside surface 220 of the semiconductor substrate 200. In some embodiments, the backside bevel nozzle 412/555 may be used to dispense a liquid material onto the outer annular portion of the backside surface 220 of the semiconductor substrate 200, while the substrate is spinning at the specified rotational speed, to form the thin film 422 within the peripheral edge region 240 of the substrate 200, as shown in FIG. 4B. The drain cup 535 may additionally include one or more gas nozzles 560 for supplying various gases (e.g., purge gases, such as nitrogen) to the backside bevel area.

After depositing a thin film (e.g., a thin film 420, 422 or 424) within the peripheral edge region 240 of the semiconductor substrate 200 in step 320, the method 300 shown in FIG. 3 dispenses a processing liquid on the surface of the semiconductor substrate in step 330. The processing liquid may be dispensed within the center region 250 of the semiconductor substrate 200, while the substrate is stationary or rotating at a relatively low rotational speed, to form a puddle of the processing liquid within the center region 250. A wide variety of processing liquids may be dispensed onto the surface of the semiconductor substrate in step 330, depending on the process(es) being performed. Examples of processing liquids are discussed in more detail below. Regardless of the particular liquid used, the processing liquid dispensed in step 330 preferably has a relatively low surface tension that enables the processing liquid to spread out and evenly coat (or wet) the center region 250 of the semiconductor substrate 200.

In the method 300 shown in FIG. 3, the thin film deposited within the peripheral edge region 240 of the semiconductor substrate in step 320 provides a lower energy surface (e.g., non-wetting surface) than the surface of the substrate. When the processing liquid reaches the low energy surface provided by the thin film, molecular forces between the liquid molecules and the low energy surface increase the local surface tension of the processing liquid at the boundary of the thin film, resulting in a higher contact angle at the thin film boundary. The increased surface tension at the thin film boundary prevents the processing liquid from spreading out further over the thin film. By providing a lower energy surface than the surface of the substrate, the thin film deposited in step 320 effectively repels the processing liquid dispensed in step 330 away from the peripheral edge region 240 of the semiconductor substrate 200 to retain the puddle of the processing liquid within the center region 250 of the substrate. This enables the method 300 shown in FIG. 3 to provide complete chemical coverage of the processing liquid within the center region 250 of the substrate, which represents a distinct improvement over conventional puddle processes. The puddle retention techniques described herein are further illustrated in the embodiments shown in FIGS. 6A-6C.

Figure 6A:
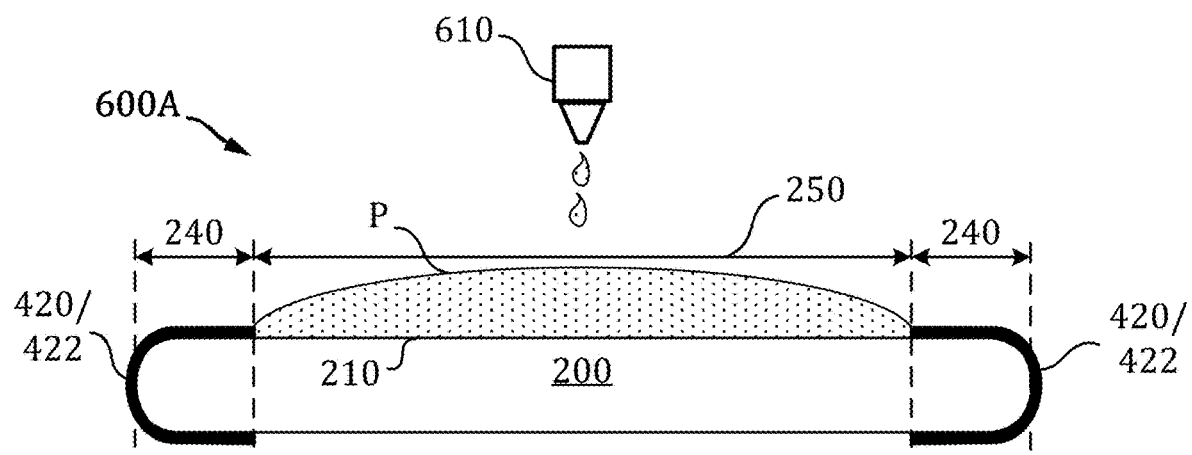
FIG. 6A is a side cross-sectional view of the semiconductor substrate (W) shown in FIG. 4A or 4B, illustrating a processing liquid being dispensed onto a frontside surface of the substrate and the puddle (P) of the processing liquid, which is retained within a center region of the substrate by the thin film formed within the peripheral edge region of the substrate.
Figure 6B:
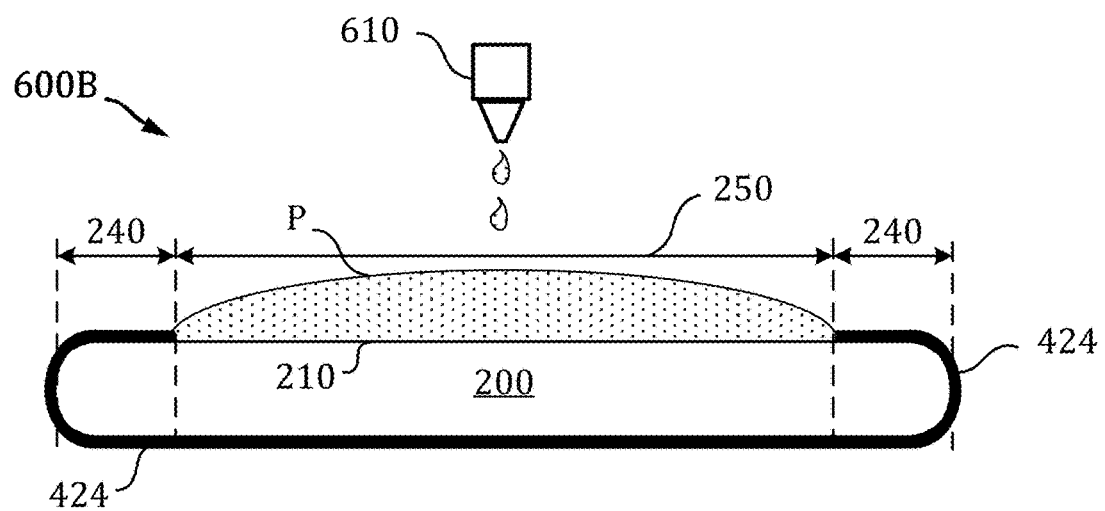
FIG. 6B is a side cross-sectional view of a semiconductor substrate shown in FIG. 4C, illustrating a processing liquid being dispensed onto a frontside surface of the substrate and the puddle (P) of the processing liquid, which is retained within a center region of the substrate by the thin film formed within the peripheral edge region of the substrate.

FIGS. 6A-6B illustrate various embodiments (600A, 600B) in which puddles (P) are formed within the center region 250 of a semiconductor substrate 200 on a frontside surface 210 of the substrate and retained by the thin films 420, 422 and 424 shown in FIGS. 4A-4C. In the embodiments shown in FIGS. 6A-6B, the puddles (P) are formed by dispensing a processing liquid from a nozzle 610 positioned above the center region 250 of the frontside surface 210 of the semiconductor substrate 200 while the substrate is stationary or spinning at relatively low rotational speed (e.g., 0 to 50 RPM).

Figure 6C:
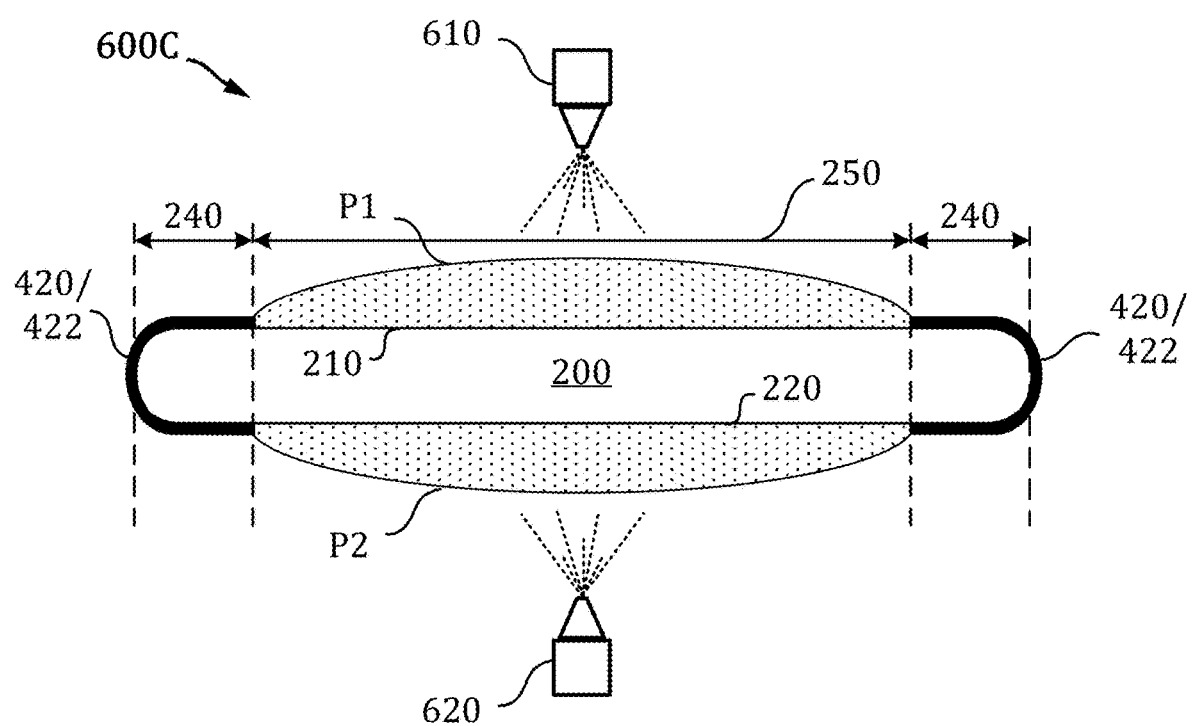
FIG. 6C is a side cross-sectional view of the semiconductor substrate shown in FIG. 4A or 4B, illustrating processing liquids being dispensed onto a frontside surface and a backside surface of the substrate and the puddles (P1 and P2) of processing liquid retained within center regions of the substrate by the thin film formed within the peripheral edge region of the substrate.

FIG. 6C illustrates an embodiment (600C) in which puddles (P1 and P2) are formed within the center region 250 of a semiconductor substrate 200 on a frontside surface 210 and on a backside surface 220 of the substrate. The puddles (P1 and P2) shown in FIG. 6C may be retained by the thin film 420 shown in FIG. 4A or the thin film 422 shown in FIG. 4B. In the embodiment shown in FIG. 6C, the puddle (P1) is formed by dispensing a processing liquid from a nozzle 610 positioned above the center region 250 of the frontside surface 210 of the semiconductor substrate 200, and the puddle (P2) is formed by dispensing a processing liquid from a nozzle 620 positioned below the center region 250 of the backside surface 220 of the semiconductor substrate 200, while the substrate is stationary or spinning at relatively low rotational speed (e.g., 0 to 50 RPM).

As noted above, the processing liquid dispensed from the nozzles 610/620 may have a relatively low surface tension, which enables the processing liquid to spread out and evenly coat (or wet) the center region 250 of the semiconductor substrate 200. When the processing liquid dispensed within the center region 250 comes in contact with the low energy surface provided by the thin film 420, 422 or 424 deposited within the peripheral edge region 240, the increased surface tension at the thin film boundary effectively repels the processing liquid away from the peripheral edge region 240 of the semiconductor substrate 200 to retain the puddle(s) of the processing liquid within the center region 250 of the substrate, as shown in FIGS. 6A-6C.

FIG. 7 illustrates one example processing chamber 700 that can be used to dispense a processing liquid onto at least one surface (e.g., a frontside surface and/or backside surface) of a semiconductor substrate 200. The processing chamber 700 shown in FIG. 7 may generally include a spin chuck 705 (e.g. a mechanical or a vacuum chuck) for holding a semiconductor substrate (W) thereon, a drive mechanism 715 for rotating the spin chuck 705 at a variety of rotational speeds, a pair of nozzles 710 and 720 for dispensing liquids (L) onto one or more surfaces of the substrate W and a cup 730 for capturing liquids, which are ejected from the surface of the substrate W by the centrifugal forces generated during rotation of the spin chuck 705. As shown in FIG. 7, the cup 730 may include a drain line 735 and drain unit (not shown) for draining liquids ejected from the substrate surface, and an exhaust line 737 and exhaust unit (not shown) for removing gaseous species from the processing space inside the cup 730.

In the embodiment shown in FIG. 7, the processing chamber 700 includes a frontside nozzle 710 and a backside nozzle 720. The frontside nozzle 710 is positioned above the semiconductor substrate W for dispensing processing liquids onto a frontside surface (such as frontside surface 210) of the substrate W. The backside nozzle 720 is provided within a central region of the spin chuck 705 for dispensing processing liquids onto a backside surface (such as backside surface 220) of the semiconductor substrate W. The nozzles 710 and 720 may dispense processing liquids onto one or more surfaces of the semiconductor substrate W, while the substrate W is stationary or spinning at a specified rotational speed.

The nozzles 710 and 720 may be used to dispense a wide variety of processing liquids onto the surface(s) of the semiconductor substrate W, depending on the process(es) being performed within the processing chamber 700. In one example, the nozzles 710 and 720 may be used to dispense a cleaning solvent, a rinsing solvent and/or a drying solvent onto one or more surfaces of the substrate W when performing a cleaning process within the processing chamber 700. In another example, the nozzles 710 and 720 may be used to dispense a coating material (e.g., a photoresist) and a developer solvent onto one or more surfaces of the substrate W when performing a photoresist patterning process. In another example, the nozzles 710 and 720 may be used to dispense an etchant chemical onto one or more surfaces of the substrate W when an etching process is performed. Other processing liquids may be dispensed onto the surfaces of the substrate W when performing other processes within the processing chamber 700, as is known in the art.

In some embodiments, the nozzles 710 and 720 may be used to dispense a processing liquid onto the surface(s) of the semiconductor substrate W, while the substrate W is spinning at a first rotational speed, to apply a coating layer evenly over the surface(s) of the substrate W or clean or rinse the surface(s) of the substrate W. In other embodiments, the nozzles 710 and 720 may be used to dispense a processing liquid onto the surface(s) of the semiconductor substrate W, while the substrate W is stationary or spinning at a second rotational speed, which is less than the first rotational speed, to form a puddle (P) within a center region 250 of the substrate, as shown in FIGS. 6A-6C and discussed above. In some embodiments, the first rotational speed may range between 100 and 2000 RPM, and the second rotational speed may range between 0 and 50 RPM.

As noted above, a wide variety of thin film materials may be deposited onto the surface of the semiconductor substrate in step 320 of the method 300 shown in FIG. 3. In addition to having a lower surface energy than that of the semiconductor substrate, the thin film material deposited within the peripheral edge region 240 of the substrate 200 is preferably one, which is not etched or dissolved by the processing liquid dispensed in step 330 of the method 300 shown in FIG. 3. In other words, the thin film material deposited within the peripheral edge region 240 is one, which is compatible with the processing liquid dispensed within the center region 250 of the substrate 200.

Examples of thin film materials that may be deposited within the peripheral edge region 240 of the semiconductor substrate 200 include, but are not limited to, fluoropolymer materials, spin-on carbon (SOC) materials, spin-on silicon carbide (SiC) materials and spin-on self-aligned monolayers (SAM). Examples of fluoropolymer films include polytetrafluoroethylene (PTFE) and perfluoroalkoxy (PFA). When applied to the peripheral edge region 240 of the semiconductor substrate 200, these thin film materials provide a low energy surface (e.g. a non-wetting surface), which repels or otherwise prevents adhesion of the processing liquids subsequently dispensed onto the substrate surface(s). When a processing liquid comes in contact with the low energy surface of the thin film material, the local surface tension is increased, resulting in a high contact angle between the processing liquid and the low energy surface. This prevents the processing liquid from adhering to and spreading over the thin film material. In some cases, the low energy surface may be a hydrophobic surface, which repels water or otherwise prevents water from adhering to the thin film material.

The thin film material and the puddle retention techniques described herein may be used to retain a puddle on a surface of a semiconductor substrate during a wide variety of processes. FIGS. 8-11 provide various examples of cleaning processes that may be improved by utilizing the puddle retention techniques described herein. It is recognized, however, that other processes may be similarly improved by utilizing the techniques described herein. For example, the disclosed techniques may also be used to retain a puddle on a surface of a semiconductor substrate during a developing process, an etching process, etc.

Figure 8:
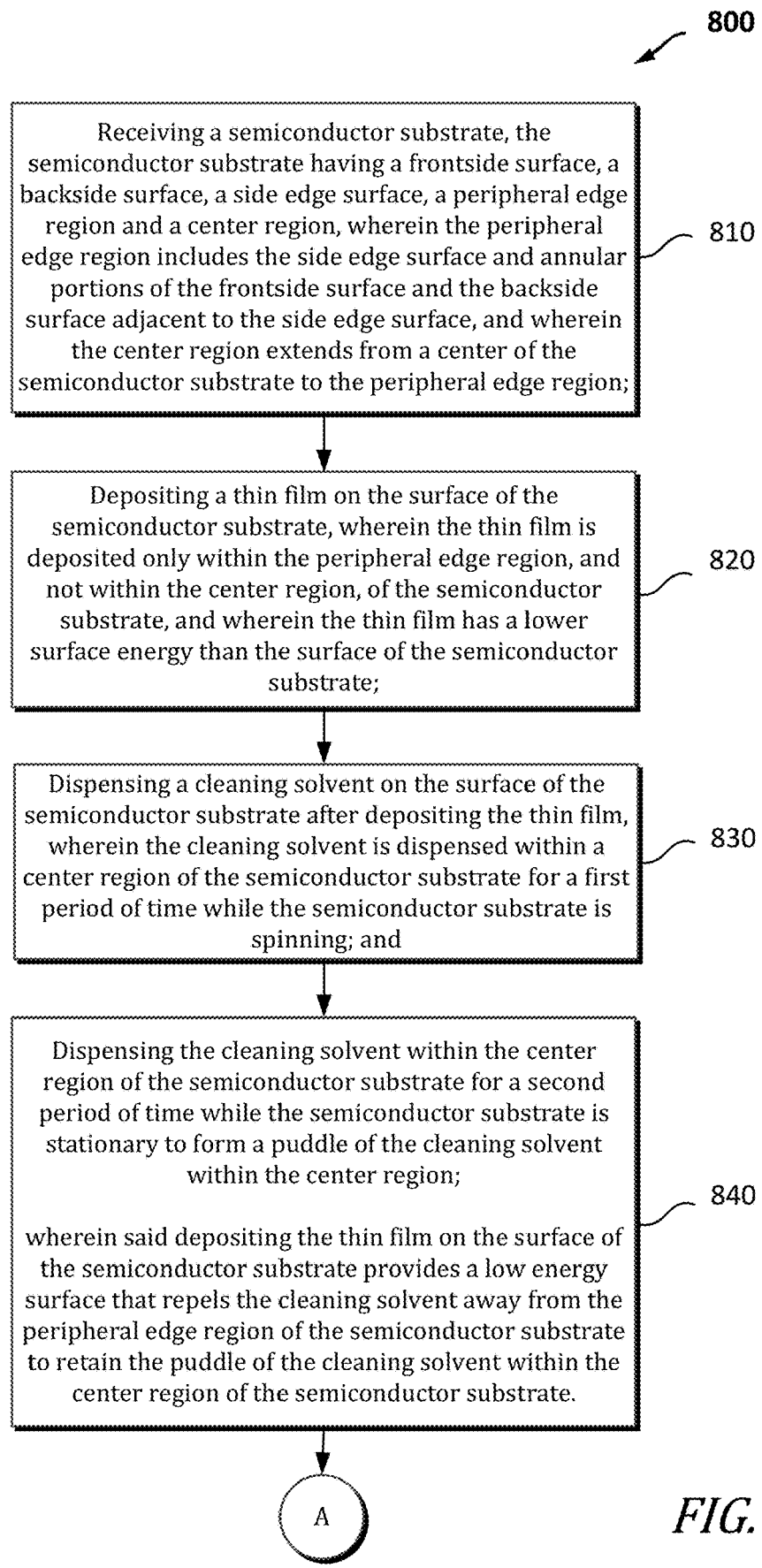
FIG. 8 is a flowchart diagram illustrating one embodiment of a method that utilizes the techniques described herein to clean a surface of a semiconductor substrate.
Figure 8:
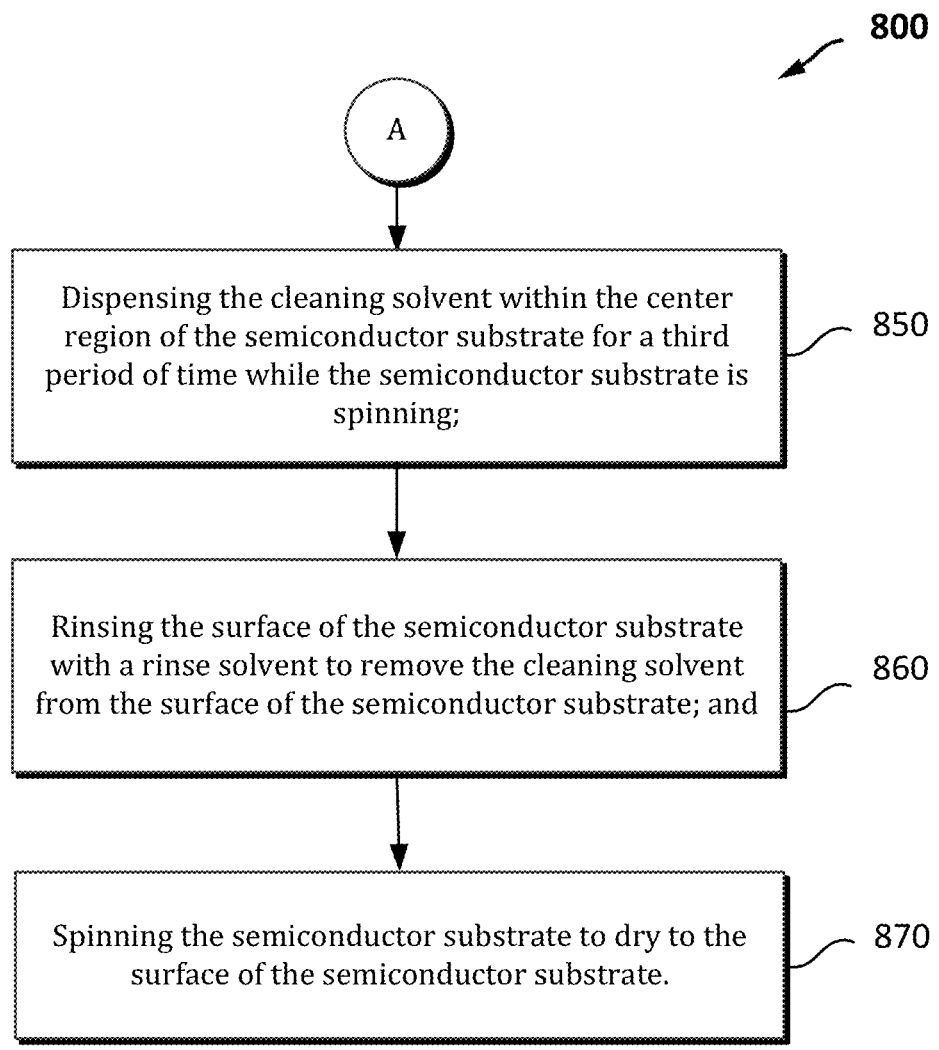

FIG. 8 and FIGS. 9A-9F illustrate one embodiment of an improved method 800 for cleaning a surface of a semiconductor substrate. As shown in FIG. 8, the method 800 may generally begin by receiving the semiconductor substrate in step 810. The semiconductor substrate received in step 810 may generally include a frontside surface 210, a backside surface 220, a side edge surface 230, a peripheral edge region 240 and a center region 250, as shown in FIGS. 2A-2C and discussed above.

After receiving the semiconductor substrate in step 810, the method 800 deposits a thin film onto a surface of the semiconductor substrate in step 820. In the method 800, the thin film is deposited only within the peripheral edge region 240, and not within the center region 250, of the semiconductor substrate in step 820. In other words, the thin film may be formed only within the bevel area of the substrate. In some embodiments, a spin-on deposition process may be used in step 820 to coat the entire peripheral edge region 240 with the thin film, including the side edge surface 230 and the annular portions of the frontside surface 210 and the backside surface 220 of the semiconductor substrate 200.

Figure 9A:
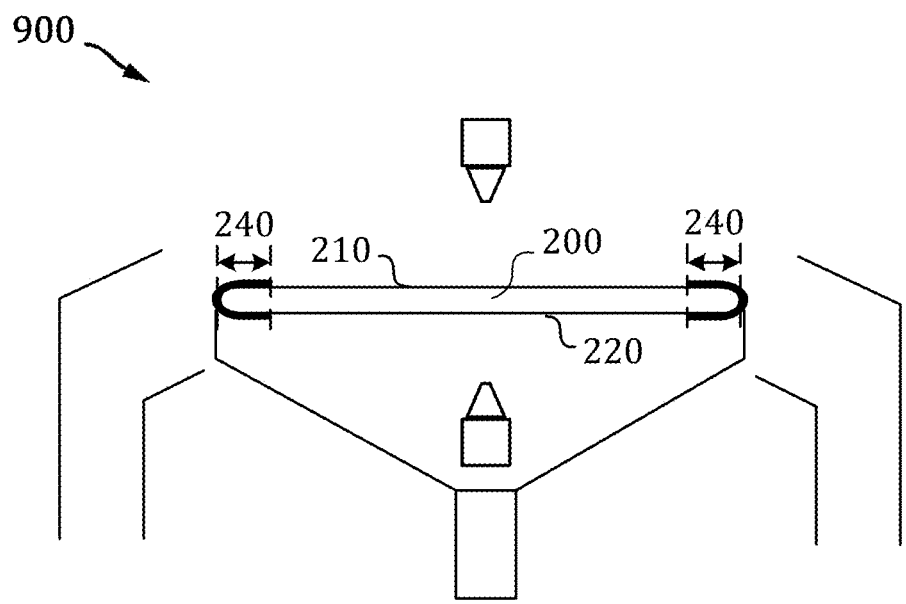
FIGS. 9A-9F illustrate example process steps that may be performed to clean at least one surface of a semiconductor substrate as described in the method of FIG. 8.
Figure 9B:
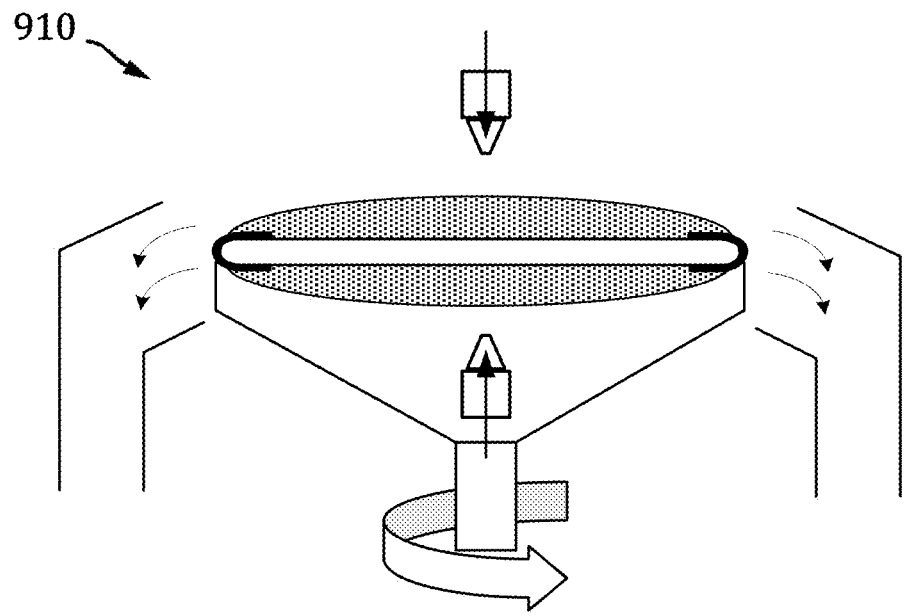

In some embodiments, a deposition chamber as shown in FIG. 5 may be utilized to perform the spin-on deposition process used to deposit the thin film in step 820. The processing chamber 500 may be used to deposit a thin film (e.g., a thin film 420, 422 or 424), as shown for example in FIG. 4A, 4B or 4C. If cleaning is desired on the frontside surface 210 and the backside surface 220 of the semiconductor substrate 200, a thin film 420 or 422 as shown in FIG. 4A or 4B may be formed within the peripheral edge region 240 of the substrate 200. In some embodiments, the semiconductor substrate may be transferred from the deposition chamber to a cleaning chamber after the thin film is deposited in step 820. In some embodiments, a bake process may be performed after the thin film is deposited in step 820 (to evaporate the solvent in the thin film material) before the semiconductor substrate is transferred to the cleaning chamber. FIG. 9A illustrates an embodiment (900) in which a semiconductor substrate 200 having a thin film deposited within a peripheral edge region 240 (or bevel area) of the substrate 200 is received within a cleaning chamber.

A variety of thin film materials may be deposited onto the surface of the semiconductor substrate (in step 820) to form the thin film within the peripheral edge region 240 of the substrate 200. Examples of thin film materials that may be deposited onto the substrate surface are discussed in more detail above. For example, the thin film material deposited in step 820 may be a fluoropolymer material (e.g., PTFE or PFA), a spin-on carbon (SOC) material, a spin-on silicon carbide (SIC) material or a spin-on self-aligned monolayer (SAM). Regardless of the particular material used, the thin film material deposited in step 820 preferably has a lower surface energy than the surface energy of the semiconductor substrate upon which the thin film is deposited. This lower energy surface enables the thin film deposited in step 820 to repel processing liquids (such as cleaning solvents, rinse solvents and/or drying solvents) away from the peripheral edge region 240. The thin film material deposited in step 820 may also be compatible with the processing liquids, so that the thin film material is not etched or dissolved by the processing liquids.

After a thin film (e.g., a thin film 420, 422 or 424) is deposited within the peripheral edge region 240 of the semiconductor substrate 200 in step 820, the method 800 shown in FIG. 8 dispenses a cleaning solvent on the surface of the semiconductor substrate in step 830. In the method 800, the cleaning solvent is dispensed within a center region 250 of the semiconductor substrate 200 for a first period of time while the semiconductor substrate is spinning, for example, at a first rotational speed (e.g., 100 and 2000 RPM). In some embodiments, the cleaning solvent may be dispensed in step 830 on only one surface (e.g., the frontside surface 210) of the semiconductor substrate. In other embodiments, the cleaning solvent may be dispensed in step 830 on the frontside surface 210 and the backside surface 220 of the semiconductor substrate 200, as shown in the embodiment 910 of FIG. 9B.

A wide variety of cleaning solvents may be dispensed in step 830. For example, a variety of standard clean 1 (SC1) and standard clean 2 (SC2) solvents may be utilized in step 830, including an ammonia/peroxide mixture (APM), a hydrochloric/peroxide mixture (HPM) and/or a sulfuric peroxide mixture (SPM). Other cleaning solvents may also be utilized in step 830, as is known in the art. As the semiconductor substrate spins, cleaning solvents dispensed onto the surface(s) of the semiconductor substrate are expelled from the surface(s), captured by the cup and discharged through the drain lines.

After the cleaning solvent is dispensed in step 830, a cleaning puddle process may be performed to improve the cleaning performance and reduce the amount of cleaning solvent utilized. For example, the method 800 may dispense the cleaning solvent within the center region 250 of the semiconductor substrate 200 for a second period of time, while the semiconductor substrate is stationary, to form a puddle (P) of the cleaning solvent within the center region 250 in step 840. In some embodiments, the cleaning solvent may be dispensed in step 840 on the frontside surface 210 and the backside surface 220 of the semiconductor substrate 200 to form a puddle (P1) on the frontside surface 210 and a puddle (P2) on the backside surface 220, as shown in the embodiment 920 of FIG. 9C. As noted above and shown in FIG. 9C, the thin film deposited on the surface of the semiconductor substrate in step 820 provides a low energy surface that repels the cleaning solvent away from the peripheral edge region 240 of the semiconductor substrate 200 to retain the puddle (P) of the cleaning solvent within the center region 250 of the substrate in step 840.

Figure 9C:
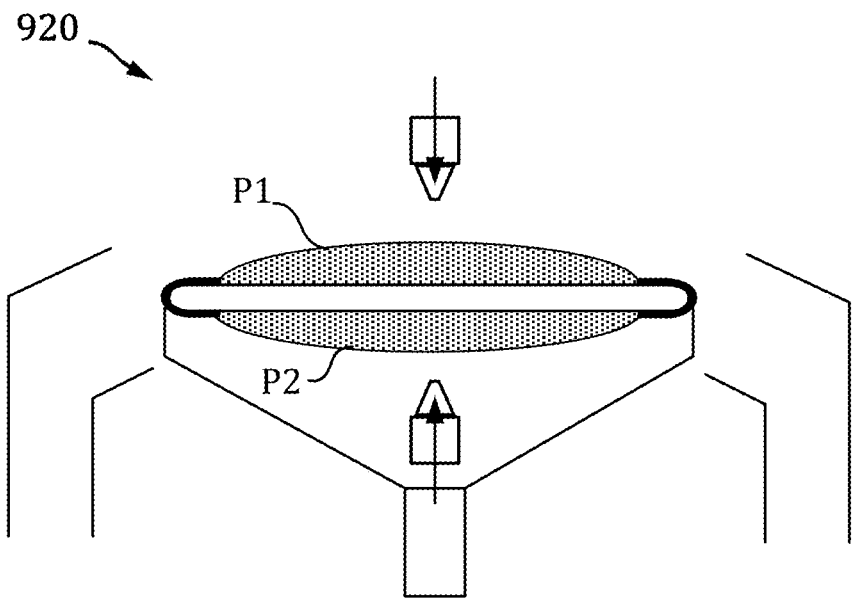
Figure 9D:
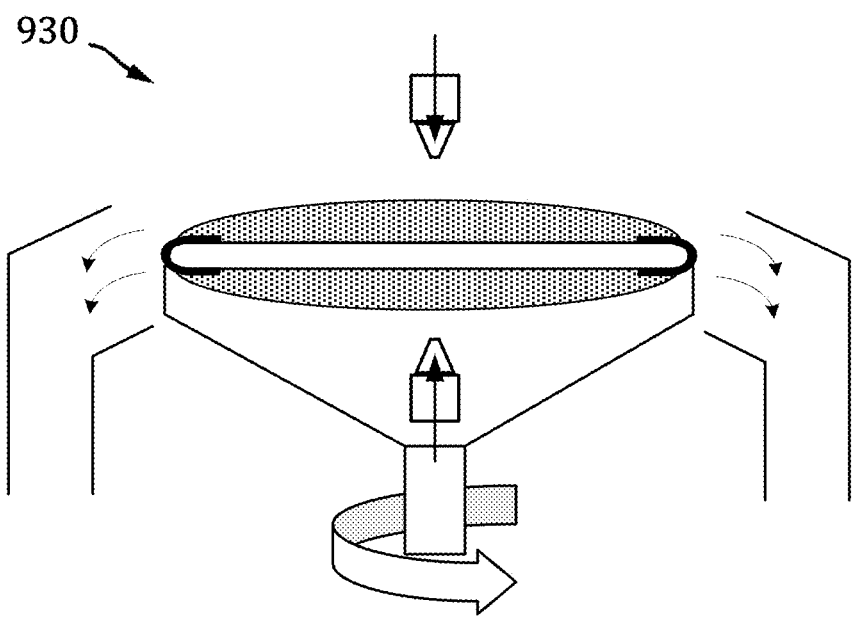
Figure 9E:
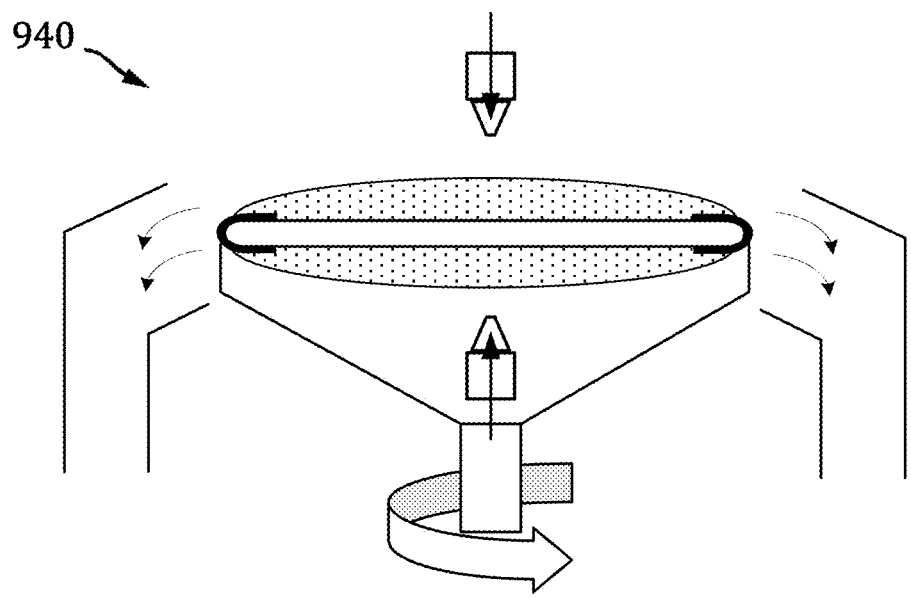
Figure 9F:
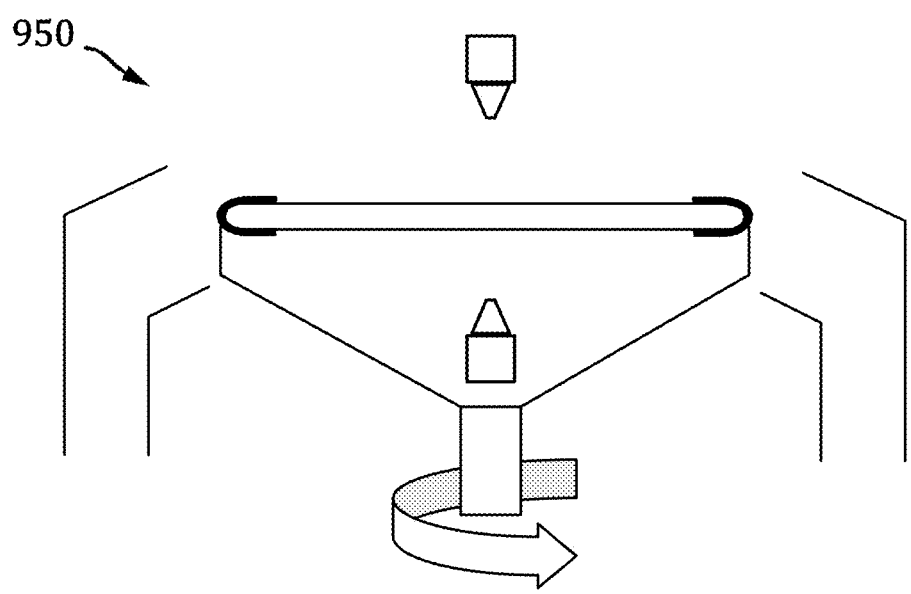

After performing a cleaning puddle process as described in step 840 and shown in FIG. 9C, the method 800 shown in FIG. 8 may perform a second cleaning step (in step 850) by dispensing the cleaning solvent within the center region 250 of the semiconductor substrate for a third period of time while the semiconductor substrate is spinning, as shown in the embodiment 930 of FIG. 9D, before rinsing the surface of the semiconductor substrate 200 with a rinse solvent (in step 860) to remove the cleaning solvent from the surface(s) of the semiconductor substrate, as shown in the embodiment 940 of FIG. 9E. A variety of rinse solvents may be used in step 860 to rinse the surface(s) of semiconductor substrate. In some embodiments, deionized water may be used as the rinse solvent. As the semiconductor substrate spins, the cleaning solvent and the rinse solvent dispensed onto the surface(s) of the semiconductor substrate are expelled from the surface(s), captured by the cup and discharged through the drain lines. After the surface(s) of the semiconductor substrate are rinsed in step 860, the method 800 may continue to spin the semiconductor substrate (in step 870) to dry the surface of the semiconductor substrate in a spin dry step, as shown in the embodiment 950 of FIG. 9F.

FIGS. 10 and 11A-11F illustrate another embodiment of an improved method 1000 for cleaning a surface of a semiconductor substrate. Like the method 800 shown in FIG. 8, the method 1000 shown in FIG. 10 may generally begin by receiving a semiconductor substrate in step 1010 and depositing a thin film on a surface of the semiconductor substrate in step 1020. The semiconductor substrate and the thin film may be generally configured, as described above in reference to steps 810 and 820.

Figure 11A:
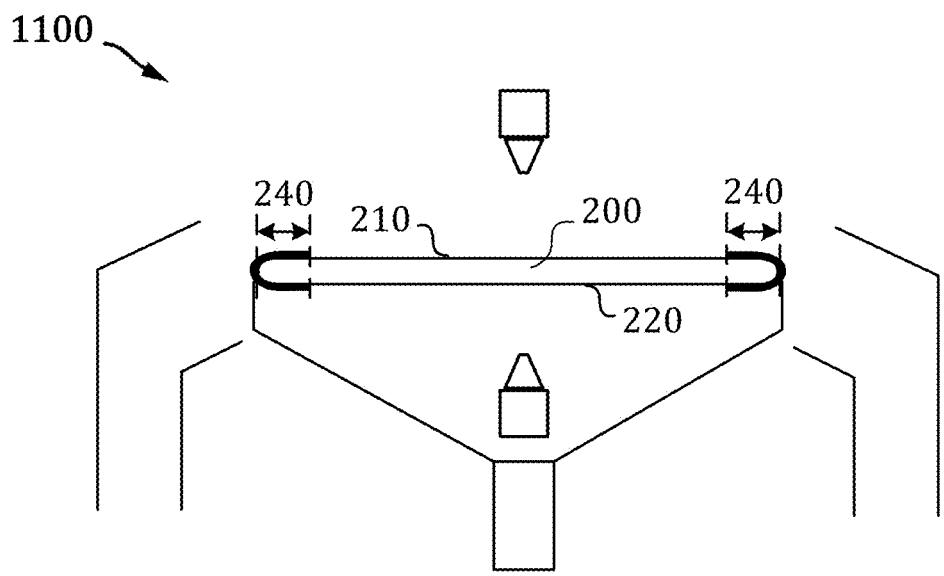
Figure 11B:
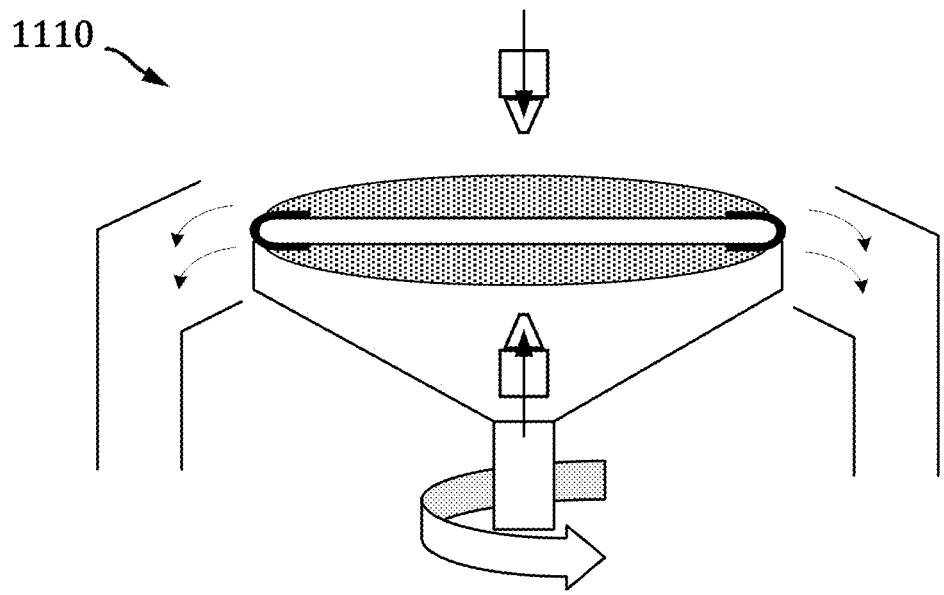
Figure 11C:
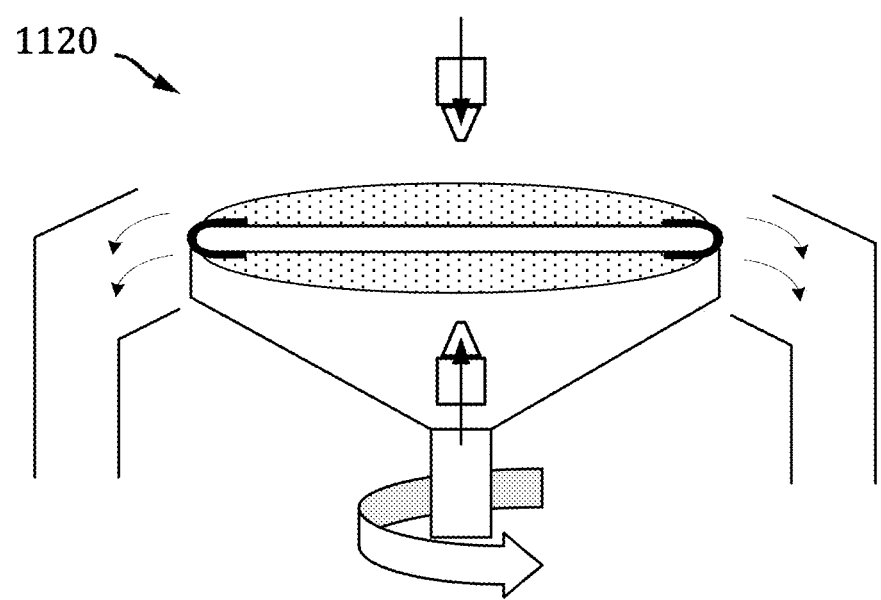

In some embodiments, a spin-on deposition process may be used in step 1020 to coat the entire peripheral edge region 240 with the thin film, including the side edge surface 230 and the annular portions of the frontside surface 210 and the backside surface 22 of the semiconductor substrate 200. In some embodiments, a deposition chamber may be used to perform the spin-on deposition process to deposit the thin film in step 1020 before the semiconductor substrate is transferred to a cleaning chamber. In some embodiments, a bake process may be performed after the thin film is deposited (to evaporate the solvent in the thin film material) before the semiconductor substrate is transferred to the cleaning chamber. FIG. 11A illustrates an embodiment (1100) in which a semiconductor substrate 200 having a thin film deposited within a peripheral edge region 240 (or bevel area) of the substrate 200 is received within a cleaning chamber.

In step 1030, the method 1000 dispenses a first solvent on the surface of the semiconductor substrate after depositing the thin film in step 1020. In the method 1000, the first solvent is dispensed within the center region 250 of the semiconductor substrate while the semiconductor substrate is spinning to clean the surface of the semiconductor substrate. The first solvent may be a cleaning solvent, as discussed above. In some embodiments, the first solvent may be dispensed in step 1030 on only one surface (e.g., the frontside surface 210) of the semiconductor substrate. In other embodiments, the first solvent may be dispensed in step 1030 on the frontside surface 210 and the backside surface 220 of the semiconductor substrate 200, as shown in the embodiment 1110 of FIG. 11B.

In step 1040, the method 1000 dispenses a second solvent on the surface of the semiconductor substrate after dispensing the first solvent in step 1030. In the method 1000, the second solvent is dispensed within the center region 250 of the semiconductor substrate 200 while the semiconductor substrate is spinning to remove the first solvent from the surface of the semiconductor substrate. The second solvent may be a rinse solvent, as discussed above. In some embodiments, the second solvent may be dispensed in step 1040 on only one surface (e.g., the frontside surface 210) of the semiconductor substrate. In other embodiments, the second solvent may be dispensed in step 1040 on the frontside surface 210 and the backside surface 220 of the semiconductor substrate 200, as shown in the step 1120 of FIG. 11C.

In step 1050, the method 1000 dispenses a third solvent on the surface of the semiconductor substrate after dispensing the second solvent in step 1040. In the method 1000, the third solvent is dispensed within the center region 250 of the semiconductor substrate while the semiconductor substrate is stationary to form a puddle (P) of the third solvent within the center region 250. The third solvent may be a drying solvent, such as isopropyl alcohol (IPA). In some embodiments, the third solvent may be dispensed in step 1050 on the frontside surface 210 of the semiconductor substrate 200 to form a puddle (P) on the frontside surface 210, as shown in the step 1130 of FIG. 11D.

In some embodiments, method steps 1030, 1040 and 1050 may be performed within a cleaning chamber, as shown for example in FIG. 7. In some embodiments, the method 1000 may transfer the semiconductor substrate from the cleaning chamber to another processing chamber in step 1060 after the third solvent is dispensed on the surface of the semiconductor substrate 200 in step 1050 to form the puddle (P) of the third solvent within the center region 250 of the substrate. In some embodiments, a semiconductor substrate having a puddle (P) formed thereon may be transferred to a supercritical processing chamber, as shown for example in the embodiments 1140 and 1150 depicted in FIGS. 11E and 11F. Once transferred to a supercritical processing chamber, the method 1000 may treat the surface of the semiconductor substrate with supercritical carbon dioxide ($CO_2$) before drying the surface of the semiconductor substrate.

Figure 10:
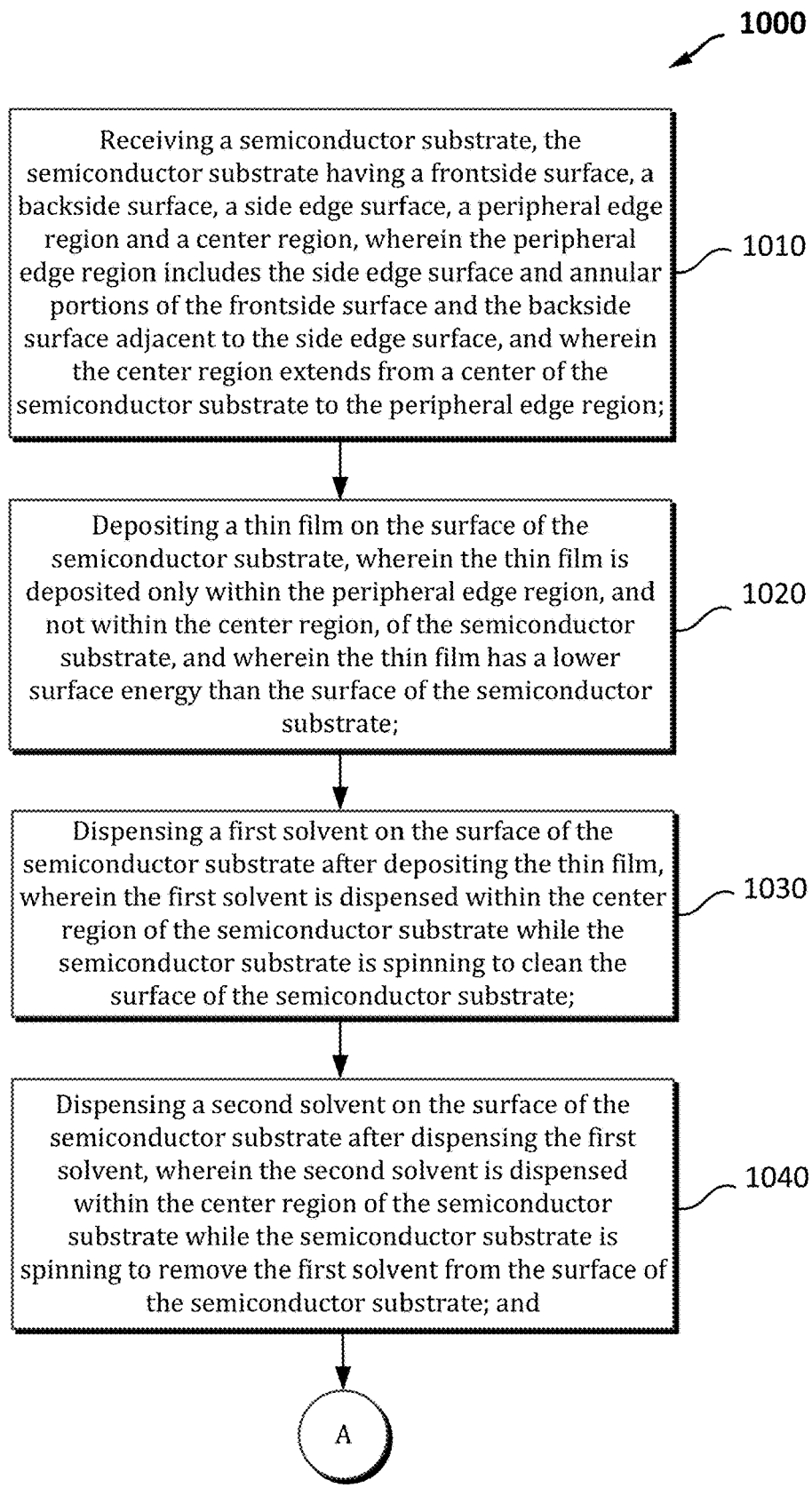
FIG. 10 is a flowchart diagram illustrating another embodiment of a method that utilizes the techniques described herein to clean a surface of a semiconductor substrate.
Figure 10:
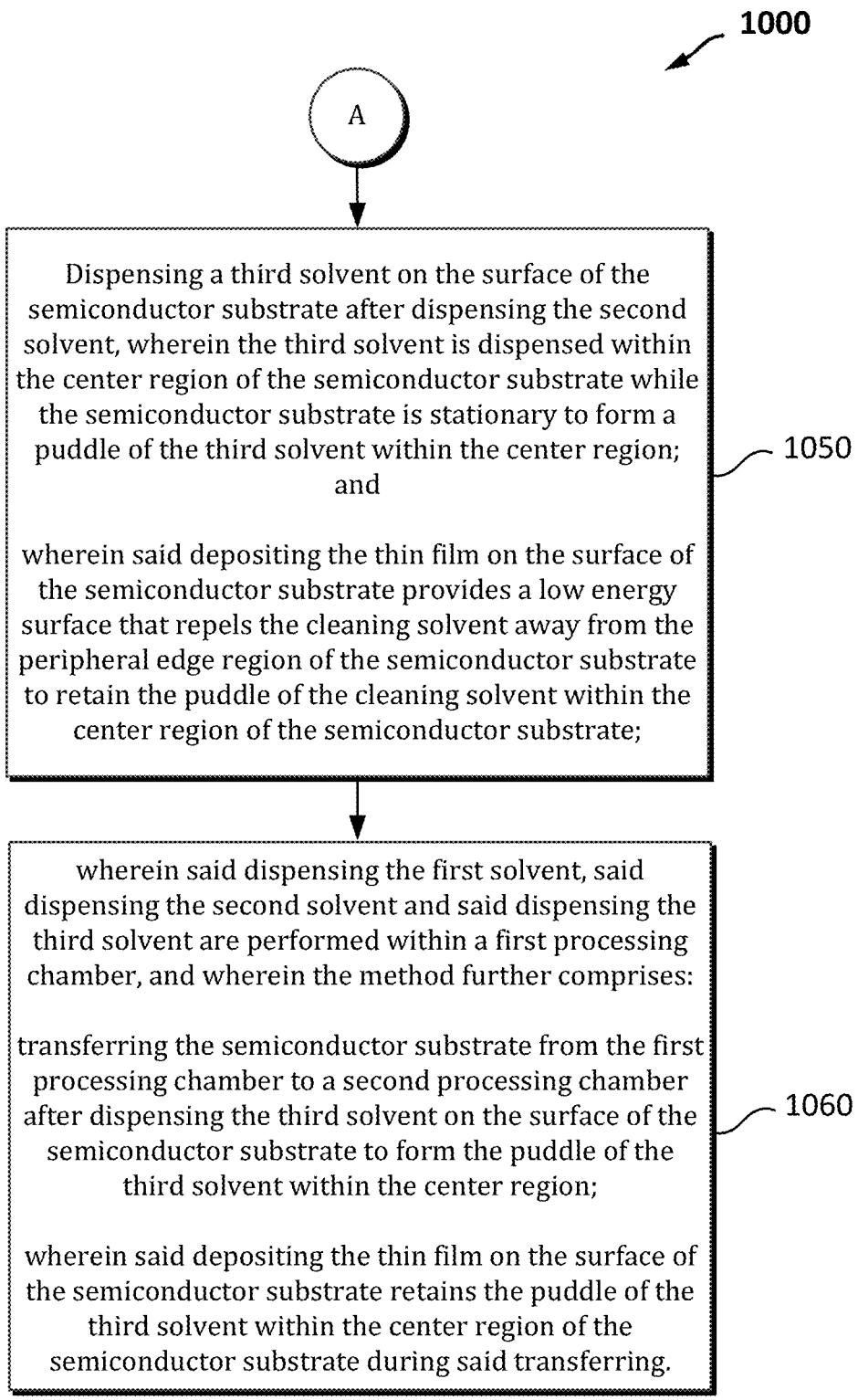

In the method 1000 shown in FIG. 10, the thin film deposited on the surface of the semiconductor substrate in step 1120 provides a low energy surface that repels the third solvent away from the peripheral edge region 240 of the semiconductor substrate 200 to retain the puddle (P) of the third solvent within the center region 250 of the substrate 200. The puddle (P) is retained not only during the puddle process shown in FIG. 11D, but also during the wafer transfer process shown in FIG. 11E. This enhances the performance of the puddle clean process and the supercritical $CO_2$ drying process and represents a distinct advantage over conventional cleaning processes.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for retaining a processing liquid on a surface of a semiconductor substrate, the method comprising:
   receiving the semiconductor substrate on a spin chuck, the semiconductor substrate having a frontside surface, a backside surface, a side edge surface, a peripheral edge region and a center region, wherein the peripheral edge region includes: (i) the side edge surface, (ii) an annular portion of the frontside surface adjacent to the side edge surface, and (iii) an annular portion of the backside surface adjacent to the side edge surface, and wherein the center region extends from a center of the semiconductor substrate to the peripheral edge region;
   depositing a film on the semiconductor substrate, wherein the film is deposited only within the peripheral edge region, and not within the center region, of the semiconductor substrate, wherein the film coats an entirety of the peripheral edge region, including the side edge surface and the annular portions of the frontside surface and the backside surface of the semiconductor substrate, and wherein the film has a lower surface energy than a surface energy of the surface of the semiconductor substrate; and
   dispensing the processing liquid on the semiconductor substrate after depositing the film, wherein the processing liquid is dispensed within the center region of the semiconductor substrate to form a puddle of the processing liquid within the center region, and wherein the lower surface energy of the film repels the processing liquid away from the peripheral edge region of the semiconductor substrate to retain the puddle of the processing liquid within the center region of the semiconductor substrate.

2. The method of claim 1, wherein said depositing the film comprises using a spin-on process to coat the entirety of the peripheral edge region with the film, including the side edge surface and the annular portions of the frontside surface and the backside surface of the semiconductor substrate.

3. The method of claim 1, wherein said depositing the film comprises depositing the film within the peripheral edge region of the semiconductor substrate while the semiconductor substrate is spinning at a first rotational speed, and wherein said dispensing the processing liquid comprises dispensing the processing liquid within the center region of the semiconductor substrate while the semiconductor substrate is stationary or spinning at a second rotational speed, which is less than the first rotational speed, to form the puddle of the processing liquid within the center region.

4. The method of claim 1, wherein said depositing the film comprises depositing a material within the peripheral edge region of the semiconductor substrate that is not etched or dissolved by the processing liquid.

5. The method of claim 1, wherein said dispensing the processing liquid is performed within a first processing chamber, and wherein the method further comprises:
   transferring the semiconductor substrate from the first processing chamber to a second processing chamber after dispensing the processing liquid on the semiconductor substrate;
   wherein said depositing the film on the semiconductor substrate retains the puddle of the processing liquid within the center region of the semiconductor substrate during said transferring.

6. The method of claim 3, wherein the first rotational speed is selected from a first range consisting of 200 to 3000 rotations per minute (RPM) and the second rotational speed is selected from a second range consisting of 0 to 50 RPM.

7. The method of claim 4, wherein said depositing the film comprises depositing a fluoropolymer material, a spin-on carbon (SOC) material, a spin-on silicon carbide (SiC) material or a spin-on self-aligned monolayer (SAM) within the peripheral edge region of the semiconductor substrate.

8. The method of claim 4, wherein said dispensing the processing liquid comprises dispensing a cleaning solvent, a rinsing solvent, a drying solvent, a developer solvent or an etchant chemical within the center region of the semiconductor substrate.

9. The method of claim 4, wherein said depositing the film is performed within a processing chamber comprising a frontside bevel nozzle, and wherein said depositing the film comprises:
   using the frontside bevel nozzle to deposit the material onto the annular portion of the frontside surface while spinning the semiconductor substrate at a rotational speed, which causes the deposited material to wrap around the side edge surface of the semiconductor substrate to coat the annular portion of the backside surface.

10. The method of claim 4, wherein said depositing the film is performed within a processing chamber comprising a backside bevel nozzle, and wherein said depositing the film comprises:
   using the backside bevel nozzle to deposit the material onto the annular portion of the backside surface while spinning the semiconductor substrate at a rotational speed, which causes the deposited material to wrap around the side edge surface of the semiconductor substrate to coat the annular portion of the frontside surface.

11. The method of claim 4, wherein said depositing the film is performed within a processing chamber comprising a backside nozzle, and wherein said depositing the film comprises:
using the backside nozzle to deposit the material onto the backside of the semiconductor substrate near the center of the semiconductor substrate while spinning the semiconductor substrate at a rotational speed, which causes the deposited material to cover the backside surface and wrap around the side edge surface of the semiconductor substrate to coat the annular portion of the frontside surface.

12. A method for cleaning a surface of a semiconductor substrate, the method comprising:
receiving the semiconductor substrate on a spin chuck, the semiconductor substrate having a frontside surface, a backside surface, a side edge surface, a peripheral edge region and a center region, wherein the peripheral edge region includes: (i) the side edge surface, (ii) an annular portion of the frontside surface adjacent to the side edge surface, and (iii) an annular portion of the backside surface adjacent to the side edge surface, and wherein the center region extends from a center of the semiconductor substrate to the peripheral edge region;
depositing a film on the semiconductor substrate, wherein the film is deposited only within the peripheral edge region, and not within the center region, of the semiconductor substrate, wherein the film coats an entirety of the peripheral edge region, including the side edge surface and the annular portions of the frontside surface and the backside surface of the semiconductor substrate, and wherein the film has a lower surface energy than a surface energy of the surface of the semiconductor substrate;
dispensing a cleaning solvent on the semiconductor substrate after depositing the film, wherein the cleaning solvent is dispensed within the center region of the semiconductor substrate for a first period of time while the semiconductor substrate is spinning; and
dispensing the cleaning solvent within the center region of the semiconductor substrate for a second period of time while the semiconductor substrate is stationary to form a puddle of the cleaning solvent within the center region, wherein the lower surface energy of the film repels the cleaning solvent away from the peripheral edge region of the semiconductor substrate to retain the puddle of the cleaning solvent within the center region of the semiconductor substrate.

13. The method of claim 12, wherein said depositing the film comprises using a spin-on process to coat the entirety of the peripheral edge region with the film, including the side edge surface and the annular portions of the frontside surface and the backside surface of the semiconductor substrate.

14. The method of claim 12, wherein said depositing the film comprises depositing a fluoropolymer material, a spin-on carbon (SOC) material, a spin-on silicon carbide (SiC) material or a spin-on self-aligned monolayer (SAM) within the peripheral edge region of the semiconductor substrate.

15. The method of claim 12, wherein after dispensing the cleaning solvent within the center region of the semiconductor substrate for the second period of time, the method further comprises:
dispensing the cleaning solvent within the center region of the semiconductor substrate for a third period of time while the semiconductor substrate is spinning;
rinsing the semiconductor substrate with a rinse solvent to remove the cleaning solvent from the semiconductor substrate; and
spinning the semiconductor substrate to dry the semiconductor substrate.

16. A method for cleaning a surface of a semiconductor substrate, the method comprising:
receiving the semiconductor substrate on a spin chuck, the semiconductor substrate having a frontside surface, a backside surface, a side edge surface, a peripheral edge region and a center region, wherein the peripheral edge region includes the side edge surface and annular portions of the frontside surface and the backside surface adjacent to the side edge surface, and wherein the center region extends from a center of the semiconductor substrate to the peripheral edge region;
depositing a film on the semiconductor substrate, wherein the film is deposited only within the peripheral edge region, and not within the center region, of the semiconductor substrate, wherein the film has a lower surface energy than a surface energy of the surface of the semiconductor substrate;
dispensing a first solvent on the semiconductor substrate after depositing the film, wherein the first solvent is dispensed within the center region of the semiconductor substrate while the semiconductor substrate is spinning to clean the semiconductor substrate;
dispensing a second solvent on the semiconductor substrate after dispensing the first solvent, wherein the second solvent is dispensed within the center region of the semiconductor substrate while the semiconductor substrate is spinning to remove the first solvent from the semiconductor substrate;
dispensing a third solvent on the semiconductor substrate after dispensing the second solvent, wherein the third solvent is dispensed within the center region of the semiconductor substrate while the semiconductor substrate is stationary to form a puddle of the third solvent within the center region, wherein said dispensing the first solvent, said dispensing the second solvent and said dispensing the third solvent are performed within a first processing chamber; and
transferring the semiconductor substrate from the first processing chamber to a second processing chamber after dispensing the third solvent on the semiconductor substrate to form the puddle of the third solvent within the center region;
wherein the lower surface energy of the film repels the third solvent away from the peripheral edge region of the semiconductor substrate to retain the puddle of the third solvent within the center region of the semiconductor substrate while the semiconductor substrate is stationary and during said transferring.

17. The method of claim 16, wherein said depositing the film comprises using a spin-on process to coat an entirety of the peripheral edge region with the film, including the side edge surface and the annular portions of the frontside surface and the backside surface of the semiconductor substrate.

18. The method of claim 16, wherein the first solvent is a cleaning solvent, wherein the second solvent is a rinse solvent, and wherein the third solvent is a drying solvent.

19. The method of claim 16, wherein said first processing chamber is a cleaning chamber, wherein said second processing chamber is a supercritical processing chamber, and wherein the method further comprises:
  treating the semiconductor substrate with supercritical carbon dioxide ($CO_2$); and
  drying the semiconductor substrate.

20. A method for retaining a processing liquid on a surface of a semiconductor substrate, the method comprising:
  receiving the semiconductor substrate on a spin chuck, the semiconductor substrate having a frontside surface, a backside surface, a side edge surface, a peripheral edge region and a center region, wherein the peripheral edge region includes the side edge surface and annular portions of the frontside surface and the backside surface adjacent to the side edge surface, and wherein the center region extends from a center of the semiconductor substrate to the peripheral edge region;
  depositing a film on the backside surface of the semiconductor substrate, wherein the film coats at least a portion of the backside surface and wraps around the side edge surface of the semiconductor substrate to coat the annular portion of the frontside surface, and wherein the film has a lower surface energy than a surface energy of the surface of the semiconductor substrate; and
  dispensing the processing liquid on at least one of the frontside surface and the backside surface of the semiconductor substrate after depositing the film, wherein the processing liquid is dispensed within the center region of the semiconductor substrate to form a puddle of the processing liquid within the center region, and wherein the lower surface energy of the film repels the processing liquid away from the peripheral edge region of the semiconductor substrate to retain the puddle of the processing liquid within the center region of the semiconductor substrate.

21. The method of claim 20, wherein said depositing the film is performed within a processing chamber comprising a backside bevel nozzle, and wherein said depositing the film comprises:
  using the backside bevel nozzle to deposit a liquid material onto the annular portion of the backside surface while spinning the semiconductor substrate at a rotational speed, which causes the deposited liquid material to wrap around the side edge surface of the semiconductor substrate to coat the annular portion of the frontside surface.

22. The method of claim 20, wherein said depositing the film is performed within a processing chamber comprising a backside nozzle, and wherein said depositing the film comprises:
  using the backside nozzle to deposit a liquid material onto the backside of the semiconductor substrate near the center of the semiconductor substrate while spinning the semiconductor substrate at a rotational speed, which causes the deposited liquid material to cover the backside surface and wrap around the side edge surface of the semiconductor substrate to coat the annular portion of the frontside surface.

\* \* \* \* \*